US012490400B2

(12) United States Patent
Andris et al.

(10) Patent No.: US 12,490,400 B2
(45) Date of Patent: Dec. 2, 2025

(54) FLEXIBLE POWER ELECTRONICS MODULE

(71) Applicant: Caterpillar Inc., Peoria, IL (US)

(72) Inventors: Eric M. Andris, Dunlap, IL (US); Michael R. Garrabrant, Dunlap, IL (US); Evan Blair Stumpges, Peoria, IL (US); Luke A. Ketcham, Peoria, IL (US); Daniel P. Sergison, East Peoria, IL (US)

(73) Assignee: Caterpillar Inc., Peoria, IL (US)

( * ) Notice: Subject to any disclaimer, the term of this patent is extended or adjusted under 35 U.S.C. 154(b) by 401 days.

(21) Appl. No.: 18/133,043

(22) Filed: Apr. 11, 2023

(65) Prior Publication Data

US 2024/0349436 A1   Oct. 17, 2024

(51) Int. Cl.
*H05K 7/14* (2006.01)
*H05K 7/20* (2006.01)

(52) U.S. Cl.
CPC ......... *H05K 7/14322* (2022.08); *H05K 7/209* (2013.01); *H05K 7/20927* (2013.01)

(58) Field of Classification Search
CPC .. H05K 7/1432; H05K 7/14322; H05K 7/209; H05K 7/20927; H05K 1/0203; H05K 1/145; H02M 7/003; H02M 7/44; H02M 7/537; H02M 7/5387; H02M 7/53871; H02M 1/08; H02M 1/084; H02M 1/088; H02M 3/003; B60L 1/08; B60L 3/003; B60L 15/007; B60L 50/40; B60L 50/51; B60L 50/60; B60L 53/20; B60L 53/22; B60L 2210/10; B60L 2210/20; B60L 2210/22; B60L 2210/30; B60L 2210/40
See application file for complete search history.

(56) References Cited

U.S. PATENT DOCUMENTS

| | | | |
|---|---|---|---|
| 7,164,201 B2 | 1/2007 | Manz et al. | |
| 8,604,610 B1 | 12/2013 | Hughes | |
| 9,226,431 B2 * | 12/2015 | Nakanishi | .......... H05K 7/14322 |

(Continued)

FOREIGN PATENT DOCUMENTS

| | | |
|---|---|---|
| CN | 202026236 U | 11/2011 |
| CN | 208781471 U | 4/2019 |
| CN | 212932850 U | 4/2021 |

*Primary Examiner* — Amir A Jalali
(74) *Attorney, Agent, or Firm* — Xsensus LLC

(57) ABSTRACT

A power electronics module (PEM) is constructed to convert electricity from an input form to an output form. Electrical power conversion subcircuits having input and output ports are positioned proximal to a front mounting plate. Rigid conductor elements having respective preformed shapes are constructed to electrically interconnect the subcircuits at input and output ports thereof to form a power conversion circuit selected from among multiple power conversion circuits configurable solely by selection of the conductor elements. Other preformed conductor shapes are constructed to interconnect input and output ports of the selected power conversion circuit to ports disposed on a rear mounting plate. A controller is mechanically coupled to the front mounting plate and constructed to operate the semiconductor switches in a prescribed timing that converts the electricity of the input form to the electricity of the output form by the selected power conversion circuit.

20 Claims, 20 Drawing Sheets

(56) References Cited

U.S. PATENT DOCUMENTS

| | | | |
|---|---|---|---|
| 9,355,950 B1 | 5/2016 | Bayerer | |
| 9,917,530 B2 * | 3/2018 | Dziuba | H05K 7/14329 |
| 10,523,131 B2 | 12/2019 | Li et al. | |
| 10,674,626 B2 | 6/2020 | Vatariu et al. | |
| 11,211,881 B2 * | 12/2021 | Horiuchi | H02M 5/4585 |
| 11,267,366 B2 * | 3/2022 | Wang | H05K 7/14329 |
| 12,066,780 B2 * | 8/2024 | Nakamoto | G03G 15/2064 |
| 2006/0120001 A1 | 6/2006 | Weber et al. | |
| 2011/0227408 A1 * | 9/2011 | Peterson | B60L 58/33 |
| | | | 290/1 R |
| 2015/0165929 A1 * | 6/2015 | Nakanishi | H02P 25/092 |
| | | | 318/51 |
| 2015/0173238 A1 * | 6/2015 | Nakanishi | H05K 7/20927 |
| | | | 29/830 |
| 2017/0099010 A1 * | 4/2017 | Dziuba | H02M 7/5387 |
| 2019/0372473 A1 * | 12/2019 | Young | H02M 7/003 |
| 2022/0200467 A1 * | 6/2022 | Andris | H02M 7/53871 |
| 2022/0201903 A1 * | 6/2022 | Ewald | H05K 7/209 |

\* cited by examiner

Section A

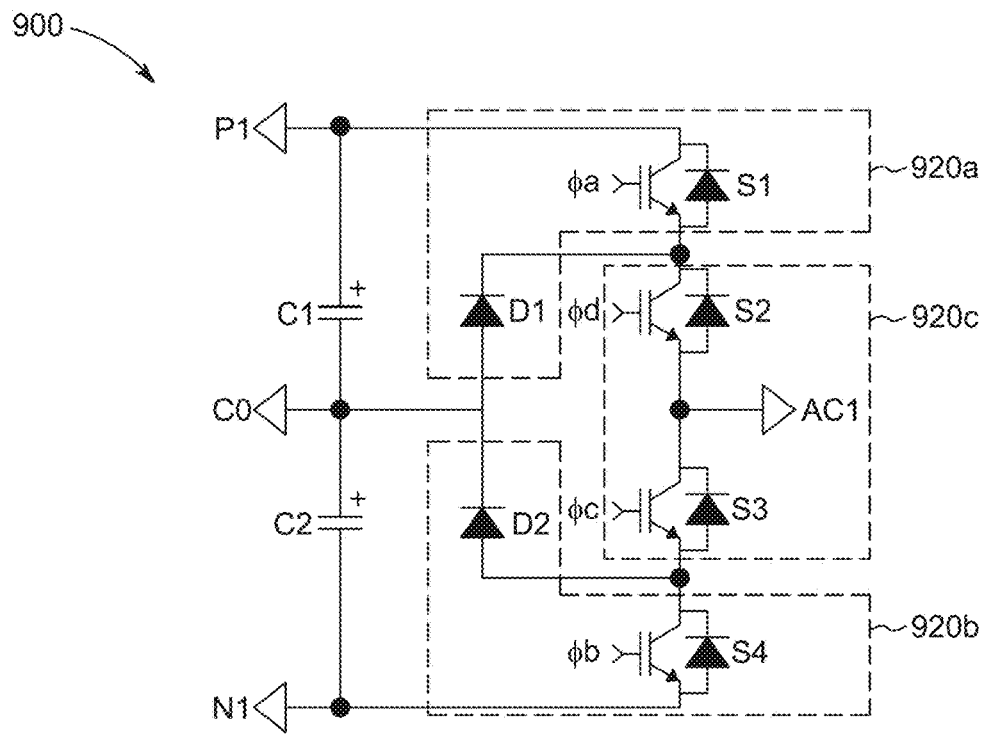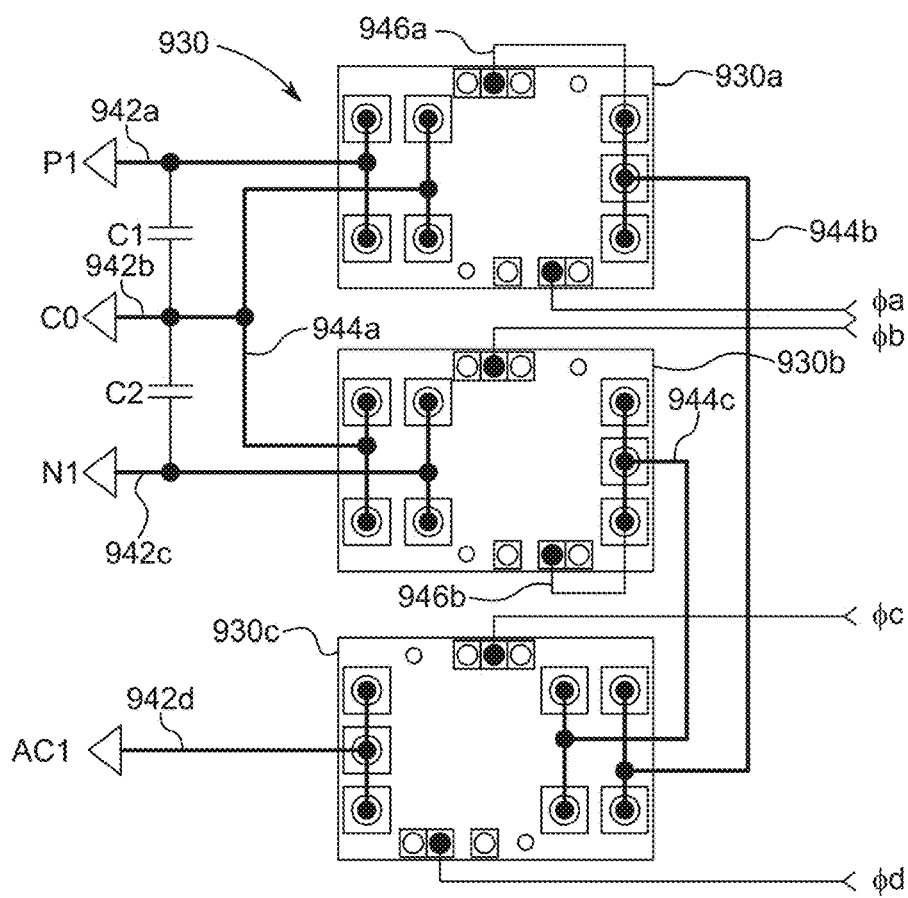
FIG. 9

FLEXIBLE POWER ELECTRONICS MODULE

TECHNICAL FIELD

The present disclosure relates to power electronics and modular assemblages of such that are configurable into various power conversion circuits within respective packages, all having a common form factor.

BACKGROUND

Work machines, such as heavy construction equipment and mining equipment, have historically utilized fossil fuels to generate power for performing the work of the corresponding work machine generation. Recent advances in battery and semiconductor switch technologies have afforded electrification in the work machine technology sector. Additionally, those same advances have afforded both miniaturization and modularity by which a common base component is configured or adapted for different purposes.

US Patent Application Publication 2006/0120001 describes a modular power supply assembly. The modular power converter includes a core power conversion module for receiving power from a power source and converting the source power from a first set of power characteristics to a second set of power characteristics. The core power conversion module has input connectors, a set of power conversion switches and associated electronics, bus capacitors, and output connectors. An application specific module containing power components and application specific components is adapted to be removably coupled to the output connector of the core power conversion module. The application specific module is designed to interface the core power conversion module to a particular power consuming application.

U.S. Pat. No. 10,523,131 describes a reconfigurable modular multilevel converter (MMC) submodule unit and control unit thereof. The reconfigurable MMC submodule unit is formed by an MMC submodule unit and a reconfigurable mechanism formed by various switches by which the topology of the MMC submodule unit is selected. The reconfigurable mechanism is embedded to the MMC submodule unit through electric connection lines or copper busbars.

Work machines such as those described above require electricity of several different forms, e.g., AC electricity at different voltage and/or current levels and DC electricity at different voltage and/or current levels that may be derived from a power source producing a single form of electricity, e.g., a chemical storage battery at a given DC voltage and/or current level. Moreover, efficient power management in such a work machine suggests a central point of power distribution. Achieving such power distribution is a topic of ongoing research, engineering and product development efforts.

SUMMARY

In one aspect of the present general inventive concept, a power electronics module (PEM) is constructed to convert electricity from an input form provided at an input port thereof to an output form provided at an output port thereof. A front mounting plate and a rear mounting plate are provided and electrical power conversion subcircuits having input and output ports are positioned proximal to the front mounting plate. Rigid conductor elements having respective preformed shapes are constructed to electrically interconnect the subcircuits at the input and output ports thereof to form a power conversion circuit selected from among multiple power conversion circuits configurable solely by selection of the conductor elements. The selected power conversion circuit has input and output ports proximal to the front mounting plate. Other rigid conductor elements having respective preformed shapes are constructed to electrically interconnect the input port of the selected power conversion circuit to the input port of the PEM disposed on the rear mounting plate and to interconnect the output port of the selected power conversion circuit to the output port of the PEM disposed on the rear mounting plate. A controller is mechanically coupled to the front mounting plate and constructed to operate the semiconductor switches in a prescribed timing that converts the electricity of the input form to the electricity of the output form by the selected power conversion circuit.

In another aspect, a power cabinet is constructed to provide electricity of multiple forms for operation of different systems of a work machine from electricity of a single form. Module bays of the power cabinet are constructed to receive respective PEMs in alignment with respective electrical busses disposed at the rear of the power cabinet and each of the PEMs are constructed to provide a corresponding one of the multiple forms of electricity. Each PEM includes a front mounting plate and a rear mounting plate and electrical power conversion subcircuits having input and output ports are positioned proximal to the front mounting plate. Rigid conductor elements having respective preformed shapes are constructed to electrically interconnect the subcircuits at the input and output ports thereof to form a power conversion circuit selected from among multiple power conversion circuits configurable solely by selection of the conductor elements. The selected power conversion circuit has input and output ports proximal to the front mounting plate. Other rigid conductor elements having respective preformed shapes are constructed to electrically interconnect the input port of the selected power conversion circuit to the input port of the PEM disposed on the rear mounting plate and to interconnect the output port of the selected power conversion circuit to the output port of the PEM disposed on the rear mounting plate. A controller is mechanically coupled to the front mounting plate and constructed to operate the semiconductor switches in a prescribed timing that converts the electricity of the input form to the electricity of the output form by the selected power conversion circuit.

In yet another aspect of the present general inventive concept, a work machine includes an onboard DC power source and components requiring multiple forms of electricity that interoperate to perform work by the work machine. A set of PEMs collectively produce the multiple forms of electricity from the onboard DC power source, each of the PEMs comprising Each PEM includes a front mounting plate and a rear mounting plate and electrical power conversion subcircuits having input and output ports are positioned proximal to the front mounting plate. Rigid conductor elements having respective preformed shapes are constructed to electrically interconnect the subcircuits at the input and output ports thereof to form a power conversion circuit selected from among multiple power conversion circuits configurable solely by selection of the conductor elements. The selected power conversion circuit has input and output ports proximal to the front mounting plate. Other rigid conductor elements having respective preformed shapes are constructed to electrically interconnect the input port of the selected power conversion circuit to the input port of the PEM disposed on the rear mounting plate and to interconnect the output port of the selected power conversion circuit to the output port of the PEM disposed on the rear mounting plate. A controller is mechanically coupled to the front mounting plate and constructed to operate the semiconductor switches in a prescribed timing that converts the electricity of the input form to the electricity of the output form by the selected power conversion circuit.

BRIEF DESCRIPTION OF THE DRAWINGS

FIG. 9 is an illustration of a neutral point clamped (NPC) inverter that can be constructed in embodiments of present inventive concept.

DESCRIPTION OF EXAMPLE EMBODIMENTS

Figure 1:
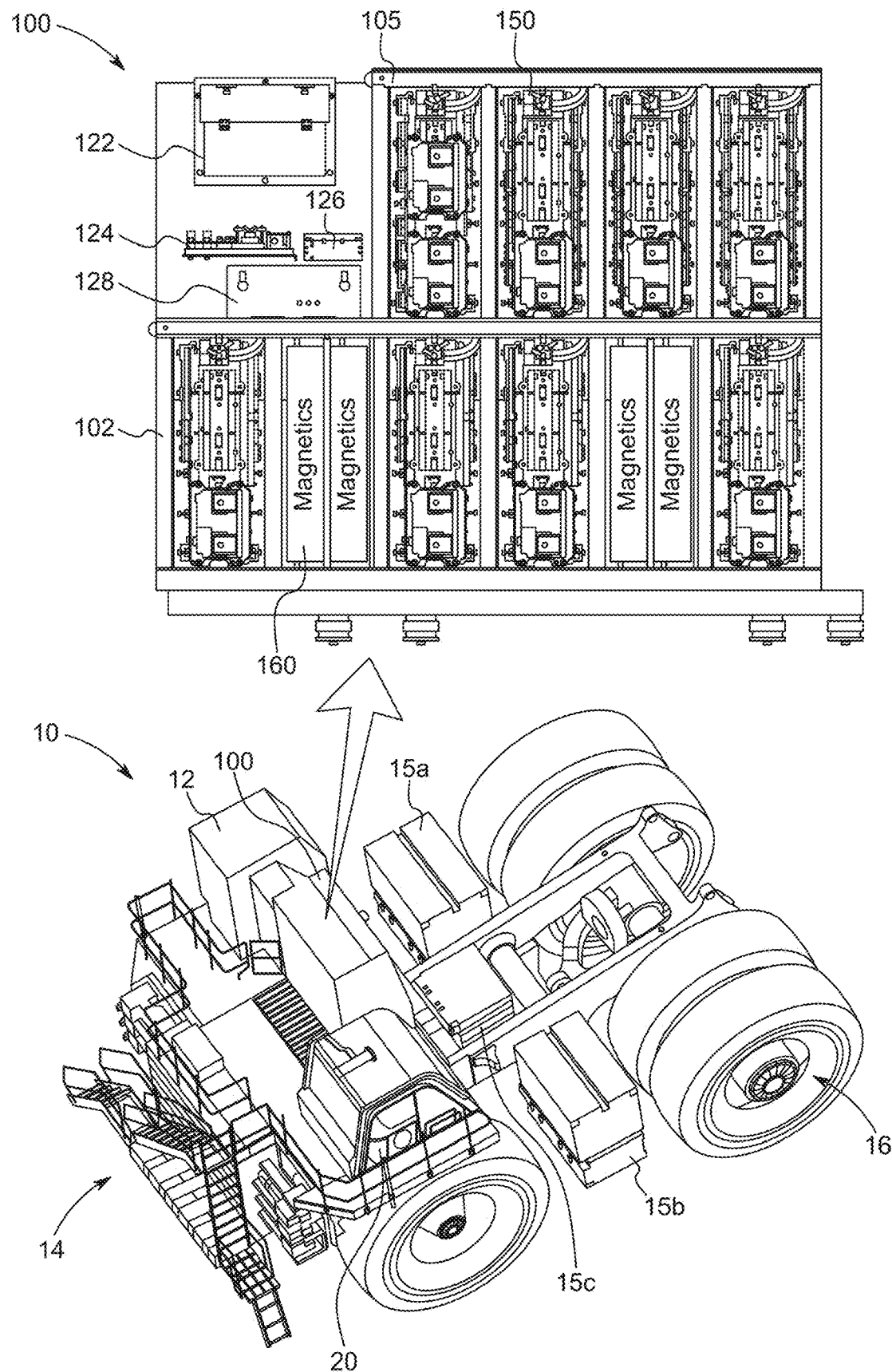
FIG. 1 is an illustration of an exemplary work machine, including a close-up side elevational view of a front of an exemplary power cabinet, in which the present inventive concept may be embodied.

The present inventive concept is best described through certain embodiments thereof, which are described in detail herein with reference to the accompanying drawings, wherein like reference numerals refer to like features throughout. It is to be understood that the terms invention, when used herein, and inventive concept are intended to connote the idea underlying the embodiments described below and not merely the embodiments themselves. It is to be understood further that the general inventive concept is not limited to the illustrative embodiments described below and the following descriptions should be read in such light.

Additionally, the word exemplary is used herein to mean, "serving as an example, instance or illustration." Any embodiment of construction, process, design, technique, etc., designated herein as exemplary is not necessarily to be construed as preferred or advantageous over other such embodiments.

The figures described herein include schematic block diagrams illustrating various interoperating functional modules. Such diagrams are not intended to serve as electrical schematics, except where depicted and described as such, and interconnections illustrated are intended to depict signal flow, various interoperations between functional components and/or processes and are not necessarily direct electrical connections between such components. Moreover, the functionality illustrated and described via separate components need not be distributed as shown, and the discrete blocks in the diagrams are not necessarily intended to depict discrete electrical components.

FIG. 1 is an illustration of an exemplary work machine 10 in which the present inventive concept may be embodied. Work machine 10 may be, for example, a large mining truck (LMT) constructed to haul product about a mine site and to operate using power derived from internal or onboard direct current (DC) sources, e.g., electrochemical storage batteries, referred to herein simply as batteries, hydrogen fuel cells and others. In the illustrated example of FIG. 1, the dump bed and associated hydraulics have been omitted to reveal components that would normally be obfuscated thereby. It is to be understood that the omitted components are nevertheless to be considered as being present in the exemplary embodiment. For example, a hydraulic pump that may be used to tip the dump bed as well as to perform other hydraulic functions may not be explicitly shown in the figures, but circuitry for operating such features may nevertheless be described herein.

Work machine 10 may include an operator cab 20 from which an operator may compel several functions for performing the work for which work machine 10 was designed. To that end, work machine 10 may comprise several components and subsystems, collectively referred to herein simply as components, that operate electrically, including the aforementioned hydraulic pump. Indeed, work machine 10 may be entirely powered by onboard electrical sources to eschew greenhouse gas emissions. Among such components are traction motors, representatively illustrated at traction motors 16, by which work machine 10 is propelled over the mine site. Traction motors 16 may be electrically retarded, such as for scaling downhill grades, that may require a grid blower 12 to remove heat generated in a retarder resistor grid. Work machine 10 may also include a thermal management system 14 that includes, among other things, electrically powered coolant circulation pumps. Electrically powered components and subsystems other than those exemplified herein may also exist in a work machine 10 (or other system implementing the inventive features described herein), but the example embodiments provided herein are sufficient to demonstrate the embodied inventive concept.

Electrical components and subsystems of work machine 10 may be operated by electrical current delivered by battery packs 15a-15c, collectively referred to herein as battery pack(s) 15, at a given battery voltage, e.g., 850 VDC or 1500 VDC. The distribution of electrical power to the various components of work machine 10 and control over the form of electrical power provided to each component may be established through a common power cabinet 100. As used herein, "form of electricity" is intended to refer to defining characteristics of electrical voltage and current that distinguish one form of electrical power from another. Changes in voltage, e.g., from one DC voltage to another, and changes in frequency (where DC is considered to have a frequency of zero (0)) are both examples of converting electricity from one form to another.

FIG. 1 depicts the forward face of power cabinet 100, which may comprise module bays 105 supported in a common chassis 102 into which power circuitry, referred to herein as power modules, are inserted. Such power modules may include power electronics modules (PEMs) 150, e.g., switching circuits including inverters and converters, and magnetic circuitry modules 160, e.g., transformers, tuning inductors, etc. In addition to the individual module bays 105, power cabinet 100 may include space for other components and subsystems, e.g., a pressurization blower 122 constructed to pressurize power cabinet 100 against an influx of debris, a crowbar circuit 124 constructed to control the discharge of a medium voltage bus in the event of overvoltage shutdown and loss of medium voltage power, a grid blower motor inverter 126 for grid blower 12 and additional magnetic circuitry 128 for accessories. The present inventive concept may be embodied with such space for circuitry not implemented by a PEM 150, although such is not necessary to practice the inventive concept.

Figure 2:
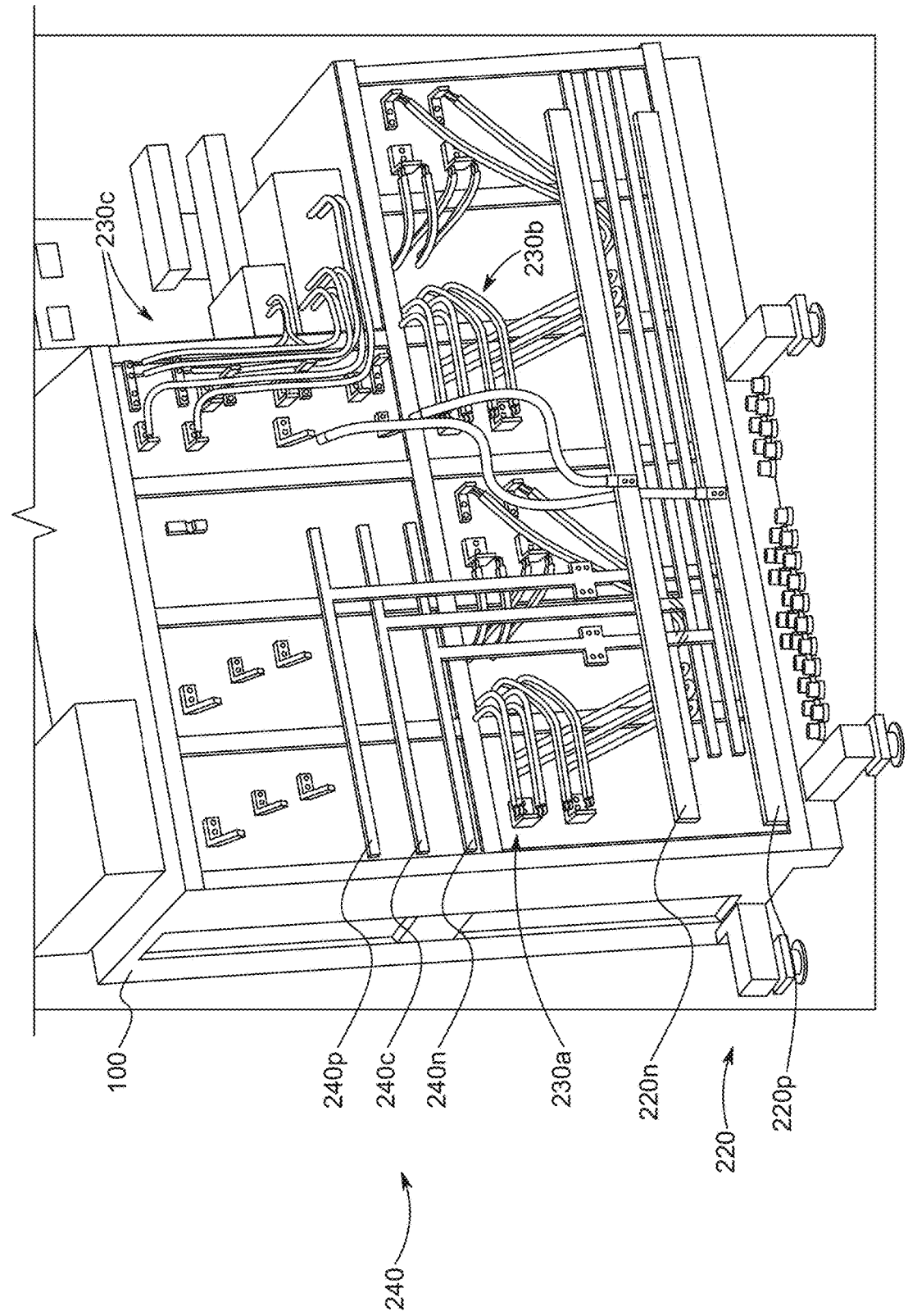
FIG. 2 is an illustration of a rear portion of an exemplary power cabinet in which the present inventive concept can be embodied.

FIG. 2 is an illustration of exemplary power cabinet 100 in which the present inventive concept can be embodied. Particularly, the figure depicts a rear view of power cabinet 100 to reveal various interconnections between the various power modules 150 and 160. For example, power cabinet 100 may comprise various electrical busses that carry current at specified voltages across power cabinet 100. Such busses may include a unipolar DC bus representatively illustrated at battery bus 220 and comprising a positive conductor 220p and a negative conductor 220n that are maintained at the battery potential. Power cabinet 100 may also include a bipolar DC bus representatively illustrated at traction bus 240 comprising a positive conductor 240p, a negative conductor 240n and a common conductor 240c. Other electrical connections may be achieved through a variety of cables as illustrated at cables 230a-230c, referred to herein as cable(s) 230. In the illustrated example, cables 230 may carry current from switching circuitry to magnetic circuitry and back to switching circuitry. Examples of such connections are illustrated below.

In certain embodiments, power modules 150 and 160 may be interconnected through battery bus 220, cables 230 and traction bus 240 to produce different forms of electricity from batteries 15, e.g., voltages higher than that of the batteries 15 and/or AC voltages (batteries 15 produce direct current (DC) in this example). The different forms of electricity may be provided to the various components of work machine 10, such as through battery bus 220, cables 230 and traction bus 240 that are sufficient to carry the respective forms of electricity. As illustrated in FIG. 2, battery bus 220 and traction bus 240 may span across power cabinet 100 to align with connections located at the rear of PEMs 150.

Figure 3A:
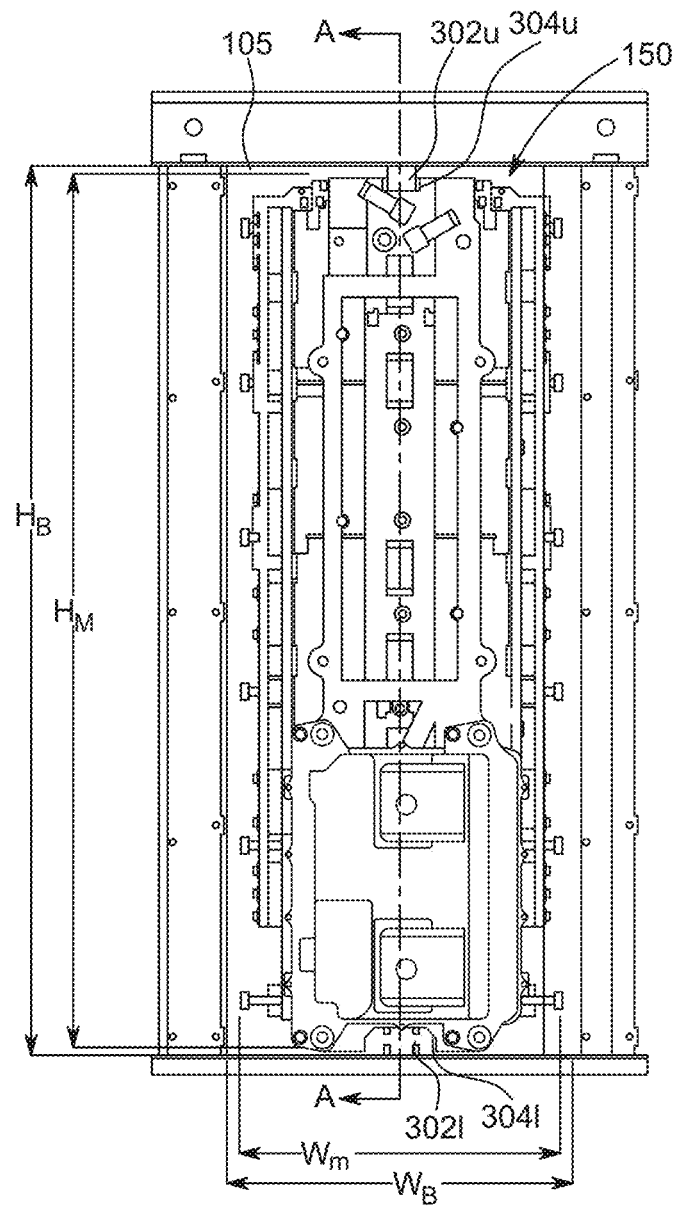
FIGS. 3A and 3B are front and side views, respectively, of an exemplary power electronics module (PEM) by which the present inventive concept can be embodied.
Figure 3B:
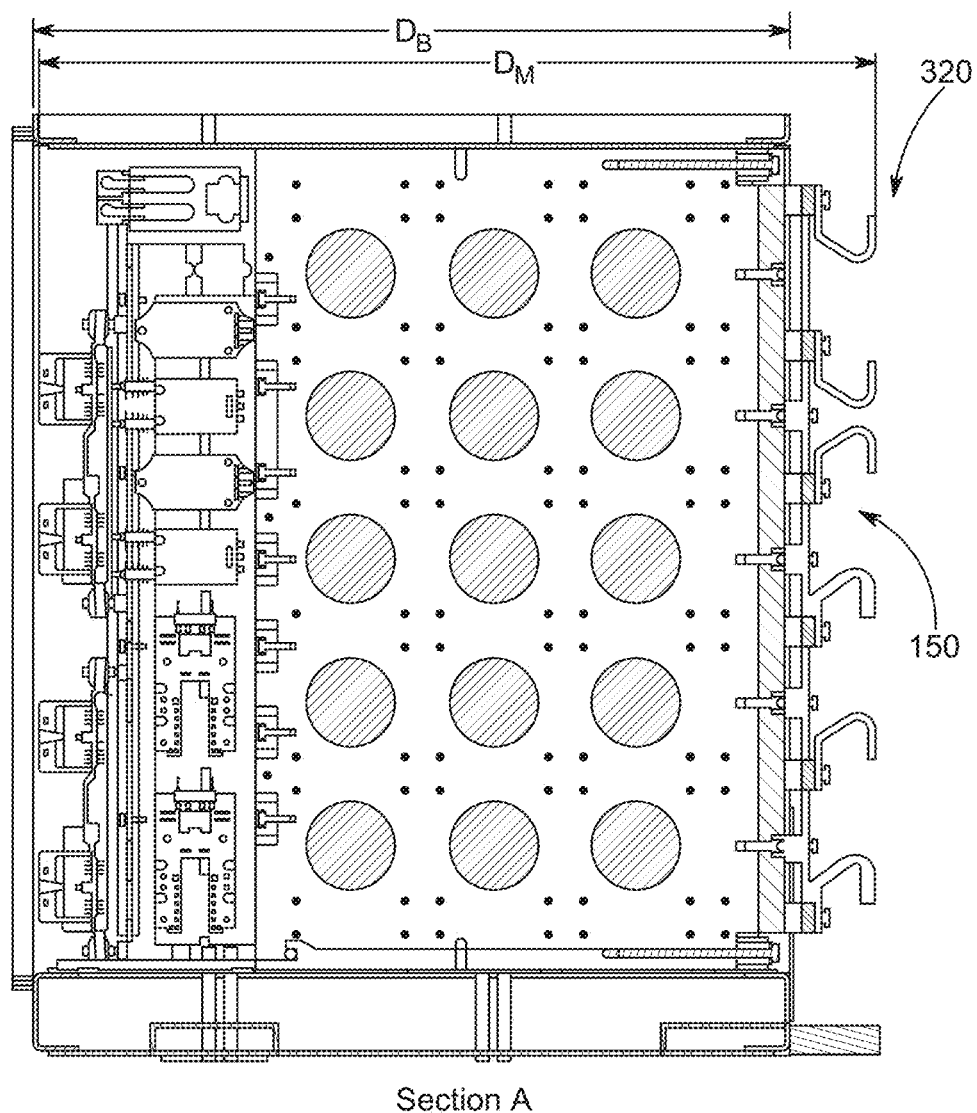

FIGS. 3A and 3B are illustrations of an exemplary PEM 150 by which the present inventive concept can be embodied. As is illustrated, PEM 150 may be sized $W_M \times H_M \times D_M$ as a form factor thereof to be properly received into a module bay 105 sized $W_B \times H_B \times D_B$. As used herein, the term "form factor" is intended to adhere to its customary definition as used in the electronic arts, namely, "the physical size and shape of an object." When PEM 150 is installed in module bay 105 and centered by engagement between bay rails 302u and 302l and respective PEM mounting grooves 304u and 304l, PEM 150 is electrically isolated from chassis 102. Additionally, certain implementations of power cabinet 100 have an open architecture in which module bay 105 is open at both forward and rearward ends of module bay 105. The widths $W_M$ and $W_B$, depths $D_M$ and $D_B$ and heights $H_M$ and $H_B$ may vary by application. It is to be noted that in the example depicted in FIG. 3, $W_M < W_B$ and $D_M > D_B$, such as for access to PEM rear plane 320 and for electrical isolation; however, the present inventive concept is not limited to this configuration. Indeed, the concept demonstrated herein through exemplary embodiments is agnostic to orientation and dimension.

Figure 4:
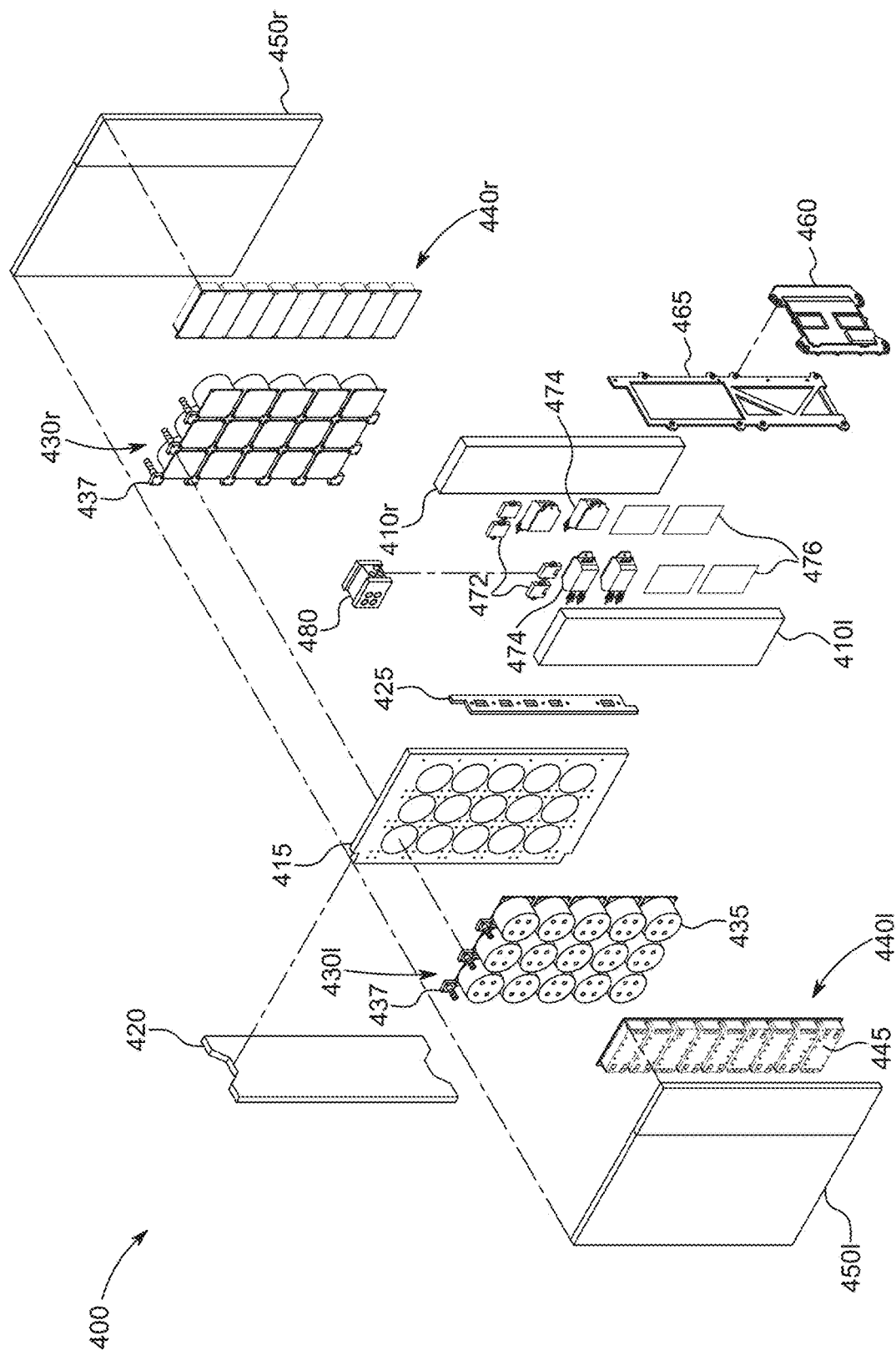
FIG. 4 is an illustration of a PEM base assembly in exploded view by which the present inventive concept can be embodied.

FIG. 4 is an illustration of a PEM base assembly 400 in exploded view by which the present general inventive concept can be embodied. As is illustrated, base assembly 400 may include a central plate 415 to which may be mechanically attached a rear mounting plate 420 on a rear edge thereof and a heatsink separation plate 425 may be mechanically attached on a forward edge thereof. In the illustrated example, the assembly of central plate 415, rear mounting plate 420 and heatsink separation plate 425 may form a rigid mechanical support structure or assembly for the remaining components of PEM 150.

Base assembly 400 may comprise left and right capacitor arrays 430l and 430r of capacitor packages, representatively illustrated at capacitor package 435. An exemplary capacitor package is described with reference to FIG. 8. As depicted in FIG. 4, a left capacitor array 430l may be disposed across one side of central plate 415 and a similar if not identical right capacitor array 430r may be disposed on the opposite side of central plate 415. In certain embodiments, every capacitor package 435 of left capacitor array 430l and of right capacitor array 430r may be directly attached to opposing sides of central plate 415, such as by screws 437, leaving all electrical terminals thereof directed outward relative to central plate 415 and thereby affording access thereto for connecting to other electrical circuitry of PEM 150.

Base assembly 400 may further comprise left and right semiconductor switch arrays 4401 and 440r of semiconductor switch packages, representatively illustrated at semiconductor switch package 445. An exemplary semiconductor switch package is described with reference to FIG. 7. As depicted in FIG. 4, left semiconductor switch array 4401 may be disposed across one side of left heatsink 4101 and a similar if not identical right semiconductor switch array 440r may be disposed across one side of right heatsink 410r. As with the capacitor packages 435 described above, semiconductor switch packages 445 of left semiconductor switch array 4401 and right semiconductor switch array 440r may be attached to their respective left heatsink 4101 and right heatsink 410r, such as by screws, leaving all electrical terminals thereof directed outward relative to central plate 415 thereby affording access thereto for connecting to other electrical circuitry of PEM 150.

In certain embodiments, left capacitor array 4301 and right capacitor array 430r may be two-dimensional M×N arrays, e.g., 3×5, and left semiconductor array 4401 and right semiconductor array 440r may be 1 $\chi$ $L_S$ linear arrays, e.g., 1×9. In one example, the outwardly facing electrical terminals of the capacitor packages 435 and of the semiconductor switch packages 445, as described above, may be substantially coplanar parallelly to central plate 415. Here, the word "substantially" is intended to convey that package terminals of capacitor packages 435 and those of semiconductor switch packages 445 can be mechanically coupled to semirigid circuit boards 4501 and 450r without warping the same.

Package terminal layout of semiconductor switch packages 445 and those of capacitor packages 435 relative to their respective internal structures (i.e., pinouts), as further described with reference to FIGS. 7 and 8, respectively, may define package orientations or polarities. In certain embodiments, the package polarities may vary throughout the particular package array, e.g., left and right capacitor arrays 4301 and 430r of capacitor packages 435, and left and right semiconductor switch arrays 4401 and 440r of semiconductor packages 445. Such varied distribution of package polarities over the arrays, e.g., left and right capacitor arrays 4301 and 430r, and left and right semiconductor switch arrays 4401 and 440r, may be selected to form electrical interconnections between the internal circuit components within those capacitor packages 435 and semiconductor switch packages 445 through conductive pathways disposed in layers of left circuit board 4501 and right circuit board 450r to form power conversion subcircuits that contain at least one semiconductor switch and at least one capacitor.

As illustrated in FIG. 4, the forward edges of left and right circuit boards 4501 and 450r may be mechanically supported by respective left and right semiconductor switch arrays 4401 and 440r to which left and right circuit boards 4501 and 450r are also electrically connected. That is, the electrical terminals on semiconductor switch packages 445 (as depicted in FIG. 7) may be threaded to accept metal screws that both secure left and right circuit boards 4501 and 450r to respective semiconductor switch arrays 4401 and 440r and that form conductive paths between the electrical terminals of semiconductor switch packages 445 and conductive traces disposed on layers of left and right circuit boards 4501 and 450r. The rearward edges of left and right circuit boards 4501 and 450r may be mechanically connected to rear mounting plate 420 thus securing both left and right circuit boards 4501 and 450r at both ends. Additionally, left and right circuit boards 4501 and 450r may be different, e.g., different peripheral features or shapes, different trace configurations on different numbers of layers, and so on. For example, one circuit board, say, left circuit board 4501 may be configured to carry a unipolar DC voltage on positive and negative conductors thereof while right circuit board 450r may be constructed or otherwise configured to carry a bipolar DC voltage on positive, common and negative conductors. It is to be understood that in addition to power conductors, e.g., unipolar DC voltage traces and bipolar DC voltage traces, left and right circuit boards 4501 and 450r may have signal traces that carry, for example, timing and control signals.

As will be demonstrated below, the opposite sides of PEM 150 may implement different electrical circuits and, as such, may not be mechanically or electrically symmetrical about central plate 415. For example, one or more semiconductor switch packages 445 and/or capacitor packages 435 may be omitted from their respective left and right semiconductor switch arrays 4401 and 440r and respective left and right capacitor arrays 4301 and 430r when fewer semiconductor switches and capacitors are sufficient to implement the functions on each side of the resulting PEM 150.

As illustrated in FIG. 4, left and right semiconductor switch arrays 4401 and 440r may be mechanically attached to respective left and right heatsinks 4101 and 410r. Additionally, left and right semiconductor switch arrays 4401 and 440r may be in thermal communication with respective left and right heatsinks 4101 and 410r to convey heat away the heat-generating left and right semiconductor switch arrays 4401 and 440r. Thermal management features that can be implemented in embodiments of the inventive concept are exemplified in FIGS. 18 and 19A-19C below. For purposes of the present discussion, it is sufficient to note that base assembly 400 may include a coolant manifold 480 mechanically interposed between left and right heatsinks 4101 and 410r that defines how circulating coolant flows through coolant channels formed therein.

In certain embodiments, the sides of left and right heatsinks 4101 and 410r opposite those on which respective left and right semiconductor switch arrays 4401 and 440r are mounted may also be populated with various components. Among such components are bleed resistor(s) 472 for reducing DC voltages within power cabinet 100 for maintenance, voltage transformer(s) 474 for measuring voltage for control purposes and interface circuit board(s) 476 for by which an electronics control module (ECM) 460 described below may communicate with other components of PEM 150. Left and right heatsinks 4101 and 410r may be installed on a heatsink separator plate 425 with left and right semiconductor switch arrays 4401 and 440r facing outward relative to heatsink separator plate 425. Bleed resistor(s) 472, voltage transformer(s) 474 and interface circuit board(s) 476 may be disposed interior to left and right heatsinks 4101 and 410r, i.e., opposite the sides of left and right heatsinks 4101 and 410r on which left and right semiconductor switch arrays 4401 and 440r are mounted.

Base assembly 400 may further include a front mounting plate 465 that may be mechanically attached to both left and right heatsinks 4101 and 410r. Front mounting plate 465 may be constructed or otherwise configured for mechanical mounting of an electronics control module (ECM) 460. ECM 460 may include circuitry within its illustrated housing such as, for example, processor circuitry, clocks and circuitry to derive different clock signals therefrom, phase-locked loop circuitry or other circuitry that modifies timing or phase as needed through feedback. Generally, ECM 460 may serve as a controller generating timing and control signals by which left and right semiconductor switch arrays 4401 and 440r are operated to convert electricity of one form into electricity of another form.

Base assembly 400, when assembled according to the illustration of FIG. 4, may serve as mechanical and electrical support for multiple PEM configurations, each being defined by appropriate selection of rigid, preformed conductors, such as those described below. Moreover, when base assembly 400 is so assembled, its peripheral dimensions may substantially define the form factor of any PEM configuration achievable through the rigid, preformed conductors. Here "substantially" is intended to include minor extensions beyond the periphery of base assembly 400, such as by rigid, preformed conductors forming electrical ports on rear mounting plate 420, as exemplified below. Base assembly 400 is itself electrically configurable, i.e., other than by the rigid, preformed conductors, such as by excluding one or more semiconductor switch packages 445 from either or both of left and right semiconductor switch arrays 4401 and 440r and/or by excluding one or more capacitor packages 435 from either or both of left and right capacitor arrays 4301 and 430r. In certain embodiments of the inventive concept, this electrical configurability within base assembly 400 is achieved without a change in the form factor of the resulting PEM.

Figure 5:
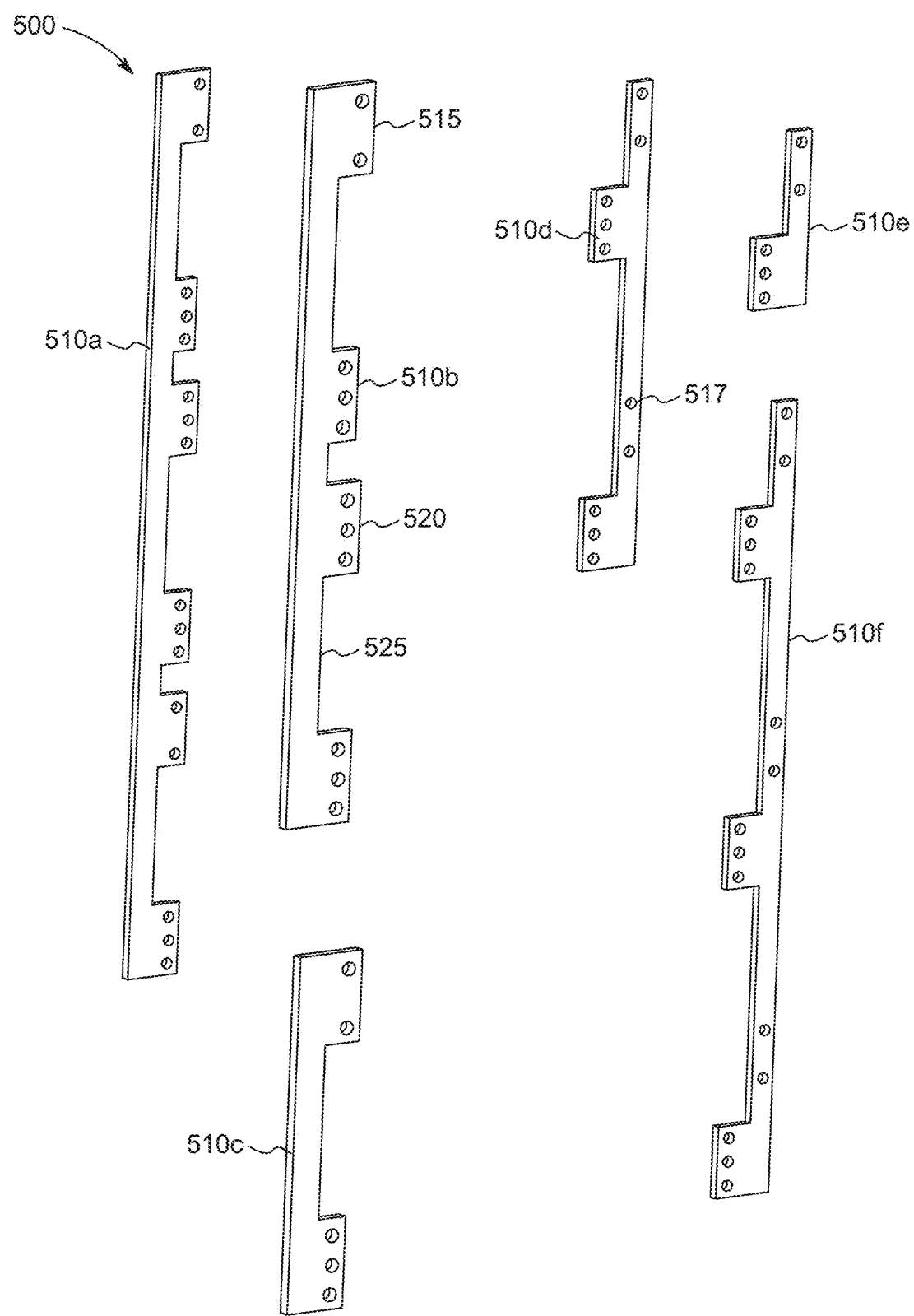
FIG. 5 is an illustration of a set of rigid edge bus connectors that can be used in embodiments of the present inventive concept.

FIG. 5 is an illustration of a set 500 of rigid, preformed edge bus conductors 510a-510f, collectively referred to herein as edge bus conductors 510, that can be used in embodiments of the present inventive concept. Edge bus conductors 510 may be preformed from a rigid conductor material, such as copper or aluminum, to include terminal bores, representatively illustrated at exemplary terminal bore 515, formed in terminal tabs, representatively illustrated at exemplary terminal tab 520, extending laterally from a conductive trunk 525. Terminal tabs 520 may be spaced apart to interconnect specific semiconductor switch packages 445 in left and right semiconductor switch arrays 4401 and 440r. Additionally, terminal bores 515 on respective terminal tabs 520 may have the same pitch or spacing as that of the terminals on semiconductor switch packages 445. It is to be noted that the number and spacing of terminal bores 515 on respective terminal tabs 520 may correspond to the number and spacing of forwardly-directed semiconductor switch terminals, i.e., semiconductor switch terminals on an end of semiconductor switch packages 445 proximal to front mounting plate 465.

In certain embodiments, left and right semiconductor switch arrays 4401 and 440r and left and right capacitor arrays 4301 and 430r as interconnected through conductors disposed in respective left and right circuit boards 4501 and 450r form power conversion subcircuits that may be connected into a single power conversion circuit by interconnecting the semiconductor switches within semiconductor switch packages 445 of respective left and right semiconductor switch arrays 4401 and 440r one to another by appropriate selection of edge bus conductors 510 from the set 500 thereof. In certain embodiments, no edge bus conductor 510 outside set 500 thereof are required to construct any of the power conversion circuits from base assembly 400 that produce multiple forms of electricity for use by work machine 10. Further, edge bus conductors 510 from which a selected power conversion circuit is constructed on one side of PEM 150 may be different than edge bus conductors 510 from which another selected power conversion circuit may be constructed on the opposite side of PEM 150, although the edge bus conductors 510 on both sides of PEM 150 may be selected from the same set 500 thereof.

Figure 6:
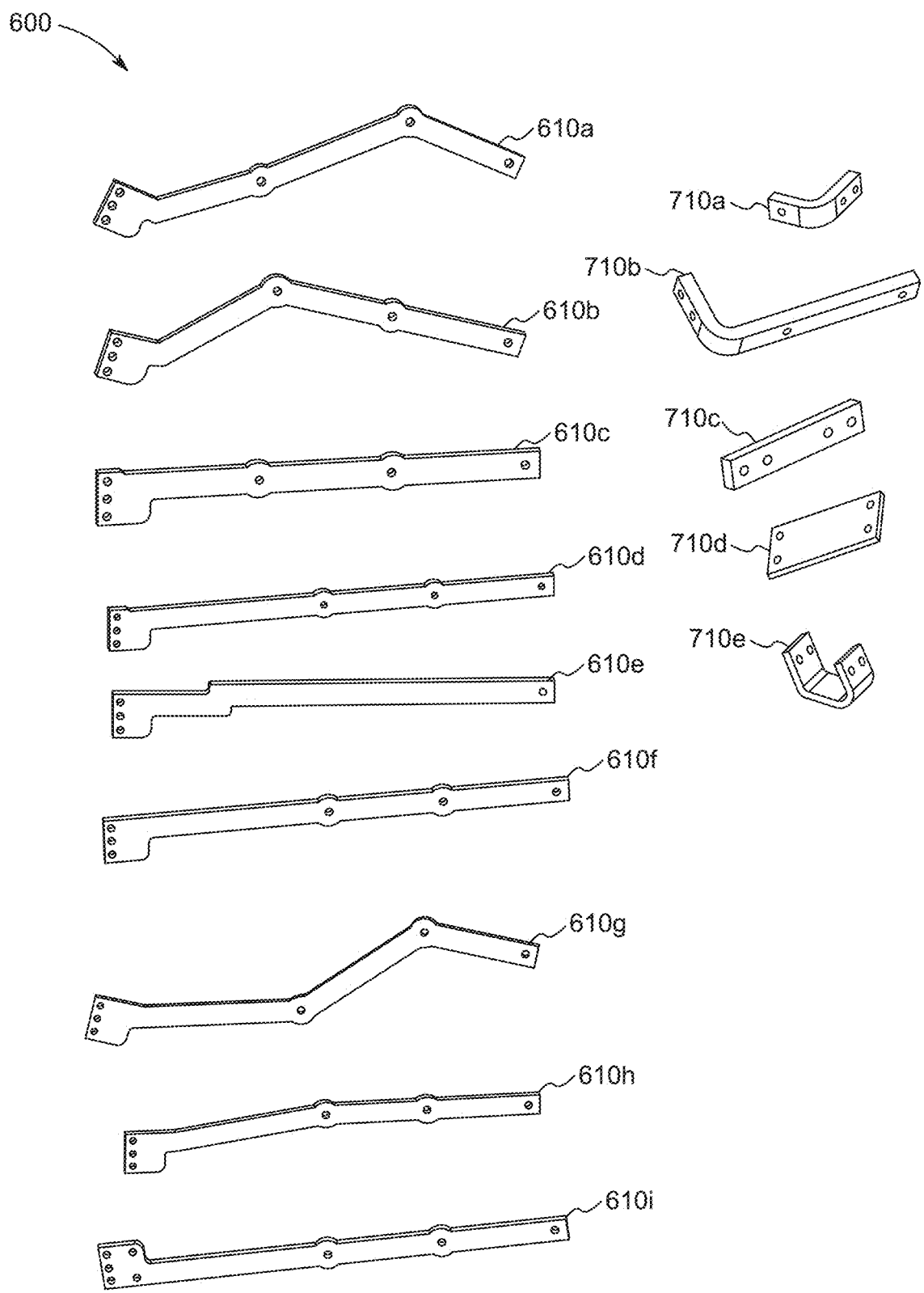
FIG. 6 is an illustration of a set of rigid transverse bus connectors that can be used in embodiments of the present inventive concept.

FIG. 6 is an illustration of a set 600 of rigid, preformed transverse bus conductors 610a-610i, collectively referred to herein as transverse bus conductors 610, and a set 700 of rigid, preformed port bus conductors 710a-710e, collectively referred to herein as port bus conductors 710, that can be used in embodiments of the present inventive concept. As described above, selection of edge bus conductors 510 from set 500 thereof when connected across left and right semiconductor switch arrays 4401 and 440r establish the function and/or topology of selected power conversion circuits on each side of PEM 150. When so connected, input and output ports of the respective power conversion circuits may be located among electrical terminals of left and right semiconductor switch arrays 4401 and 440r and, as such, may be proximal to front mounting plate 465. Transverse bus conductors 610 may be constructed or otherwise shaped to transfer the input and output ports of the respective power conversion circuits from the locations proximal to front mounting plate 465 to locations proximal to rear mounting plate 420. The locations proximal to rear mounting plate 420 may be selected to correspond with locations of busses within power cabinet 100, as illustrated in FIG. 2. Port bus conductors 710 may be constructed or otherwise shaped to form input and output ports of the respective power conversion circuits on rear mounting plate 420 by electrical connections to respective transverse bus conductors 610 from the locations proximal to rear mounting plate 420 at which they terminate. Port bus conductors 710 may further include those that electrically interconnect different ports as disposed on rear mounting plate 420.

It is to be understood that the sets of rigid, preformed conductors, e.g., sets 500, 600 and 700 may include rigid, preformed conductors having configurations not illustrated herein. Indeed, the content of rigid, preformed conductor sets 500, 600 and 700 may vary by application.

In the foregoing description, power conversion circuits and the input and output ports thereof are referred to generally without specific reference into a figure of the present patent application. There are multiple configurations of these components that implement a selected conversion from electricity of one form to electricity of another form that can be achieved by embodiments of the present inventive concept. Examples of power conversion circuits implemented in a PEM 150 according to the foregoing description along with references to described elements are provided below with reference to FIGS. 10-17. Circuits other than those illustrated and described herein may be implemented by embodying the present inventive concept as well.

Figure 7:
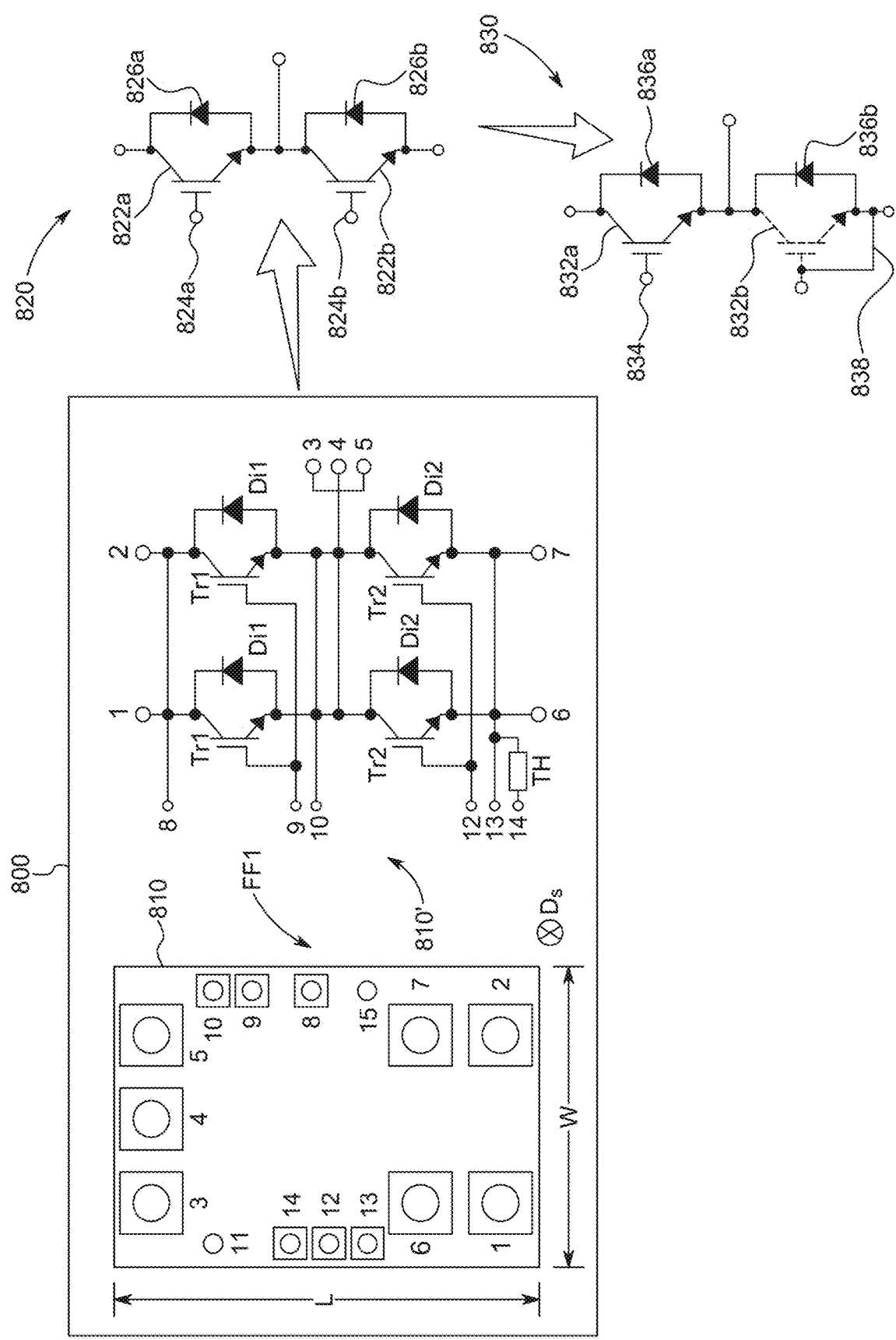
FIG. 7 is an illustration of a semiconductor switch comprising a semiconductor switch package and an internal circuit that can be used in embodiments of the present inventive concept.

FIG. 7 is an illustration of a semiconductor switch 800 comprising a semiconductor switch package 810 and an internal circuit 810' with a package pinout defining a relationship between the two. Semiconductor switch 800 may be deployed in left and right semiconductor switch arrays 4401 and 440r described above. In the illustrated example of FIG. 7, the semiconductor device architecture is that of an insulated gate bipolar transistor (IGBT) and several of such may be constructed and interconnected on a single package die. As depicted in the illustrated example, semiconductor switch 800 may be contained within an LV-100 package, but the inventive concept is agnostic to package type. Moreover, semiconductor switch 800 may be constructed or otherwise configured for high voltage applications, such as in HV-100 packages. Generally, semiconductor switch package 810 may be confined within a form factor FF1 L×W×$D_S$, where $D_S$ refers to the depth of the semiconductor switch package 810 along a dimension thereof that is normal to the drawing sheet of FIG. 7. As depicted in the figure, semiconductor switch 800 defines a physical pinout that affords description of semiconductor switch package 810 in terms of a spatial orientation or polarity. For example, semiconductor switch package 810, as illustrated in FIG. 7 with output terminals 3, 4 and 5 directed upward may establish that the semiconductor switch package 810 is in one polarity while output terminals 3, 4 and 5 directed downward may establish that the semiconductor switch package 810 is in the opposite polarity.

As illustrated in FIG. 7, semiconductor switch internal circuit 810' may comprise a dual half-bridge circuit constructed from a set of IGBTs across which respective clamping diodes are connected. To avoid unnecessary congestion in the electrical circuit schematics depicted herein, the dual half-bridge circuit may be represented by a single half-bridge circuit 820 comprising IGBTs 822a and 822b across which respective clamping diodes 824a and 824b are connected. Timing signals, such as from an ECM 460, may be applied to gates 824a and 824b to operate IGBTs 822a and 822b into conducting and nonconducting states.

One advantage of the configuration of internal circuit 810' is demonstrated by exemplary switch circuit 830 comprising IGBTs 832a and 832b across which respective clamping diodes 836a and 836b are electrically connected. Per typical IGBT operating principles, exemplary IGBT 832b is in a nonconducting state due to Vge, the potential difference between gate and emitter, being less than the IGBT's turn-on threshold voltage, as represented by the gate-to-emitter short circuit 838. IGBT 832a may be operated as a switch by application thereon of a timing signal but current flow through IGBT 832b is excluded, leaving only the current path through clamping diode 836b. In an analogous manner, exemplary IGBT 832a may be placed in its nonconducting state by ensuring Vge is less than the IGBT turn-on threshold voltage, while leaving IGBT 832b configured as a switch. Such configurability may afford the construction of power conversion building blocks, such as exemplified in FIG. 9.

Figure 8:
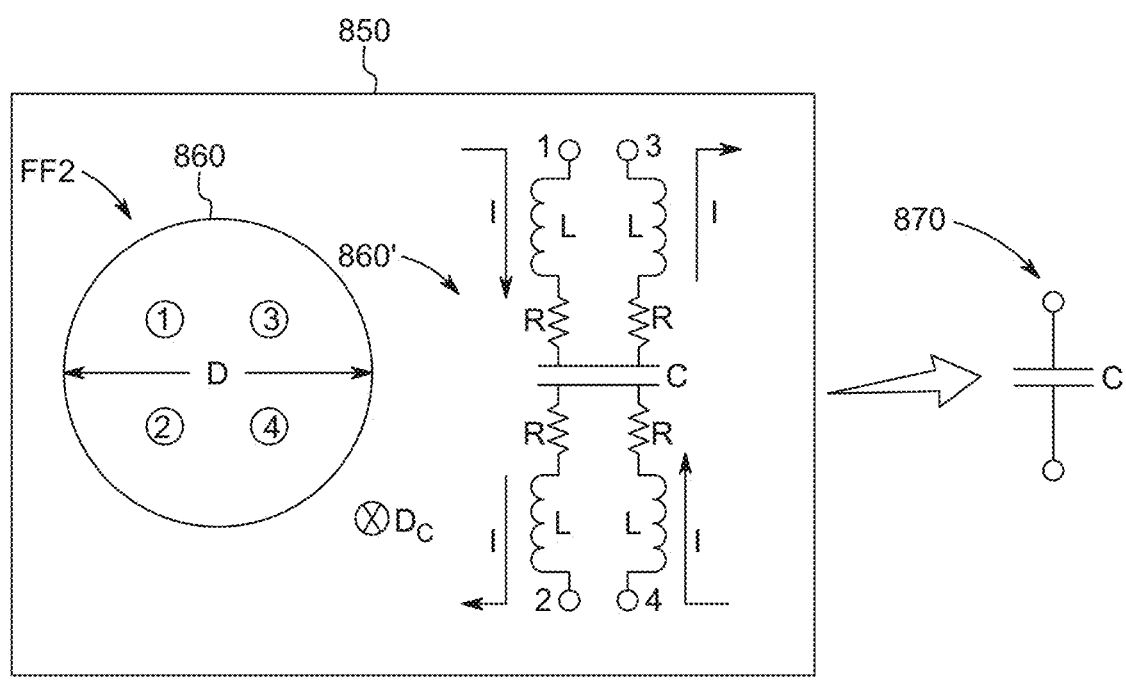
FIG. 8 is an illustration of a capacitor comprising a capacitor package and an internal circuit that can be used in embodiments of the present inventive concept.

FIG. 8 is an illustration of a capacitor 850 comprising a capacitor package 860 and an internal circuit 860' that can be used in embodiments of the present inventive concept. Capacitor package 860 may conform to a form factor FF2 L×W×$D_C$, where $D_C$ refers to the depth of the capacitor package 860 along a dimension thereof that is normal to the drawing sheet of FIG. 8.

Capacitor 850 may be of low internal inductance design, as demonstrated through exemplary internal circuit 860', in which current flow is separated across the isolated plates of capacitor C. It is to be understood, however, that other capacitor architectures may be employed in embodiments of the present inventive concept without departing from the spirit and intended scope thereof. Again, to avoid unnecessary congestion in the electrical circuit schematics depicted herein, the low inductance capacitor 850 may be represented by a standard capacitor symbol depicted at 870 of electrical capacitance C.

FIG. 9 is an illustration of an exemplary neutral point clamped (NPC) inverter 900 that can be constructed in embodiments of present inventive concept. The upper panel of FIG. 9 depicts an electrical schematic of NPC inverter 900 and the lower panel depicts an exemplary realization of NPC inverter 900 in a semiconductor switch package array 930 that may be embodied according to the present inventive concept. As illustrated in the figure, NPC inverter 900 may comprise three (3) NPC subcircuits 920a-920c, which are not to be confused with power converter subcircuits discussed above. NPC subcircuits 920a-920c may be realized by respective semiconductor switch packages 930a-930c of semiconductor switch package array 930. Semiconductor switch package array 930 includes a semiconductor switch package 930c having an opposite polarity or spatial orientation than other semiconductor switch packages 930a and 930b. As indicated above, semiconductor switch package array 930 may be positioned in a PEM embodiment of the present inventive concept proximal to its forward edge, e.g., proximal to front mounting plate 465 illustrated in FIG. 4, while certain electrical connections with other PEMs are made via connecting structures disposed at its rear, e.g., on rear mounting plate 420 illustrated in FIG. 4. Utilizing different polarities of semiconductor switch packages 930a-930c may direct high power terminals towards the rear of the PEM in which semiconductor switch package array 930 is installed.

PEMs embodied according to the present inventive concept include high power conductors that carry the main power products for operation of work machine 10, and lower power conductors that carry timing and other control signals. In certain embodiments, lower power conductors, illustrated in relatively narrower lines in FIG. 9, may be embedded in circuit boards, e.g., left and right circuit boards 450l and 450r illustrated in FIG. 4. For example, conductors for timing signals da-od and gate-to-emitter short circuits 946a and 946b by which diodes D1 and D2 are isolated, may be fulfilled by circuit connections of, for example, left and right circuit boards 450l and 450r. High power conductors, illustrated in relatively heavier lines in FIG. 9, may include, for example, members of the set 500 of edge bus conductors 510, representatively illustrated at high power conductors 944a-944d, and members of the set 600 of transverse bus conductors 610, representatively illustrated at high power conductors 942a-942d.

Figure 10:
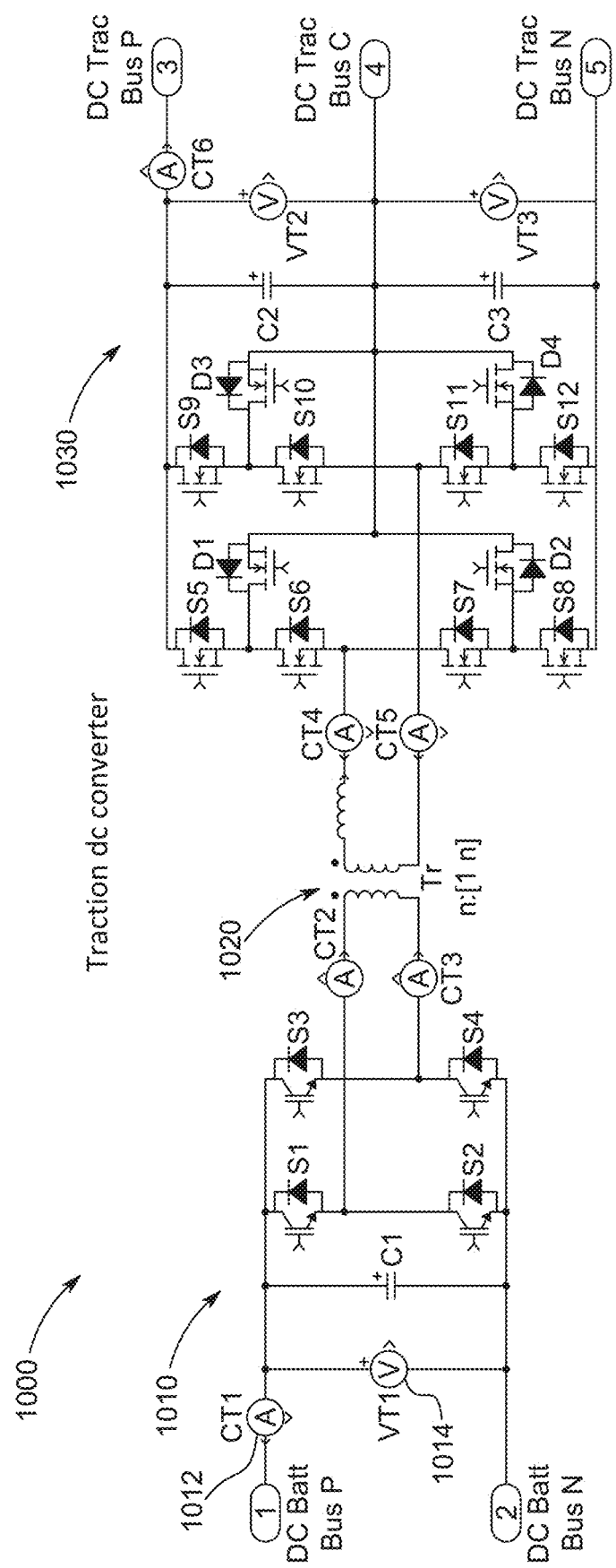
FIG. 10 is an electrical schematic diagram of an exemplary DC converter circuit that may be implemented by embodiments of the present invention.
Figure 11:
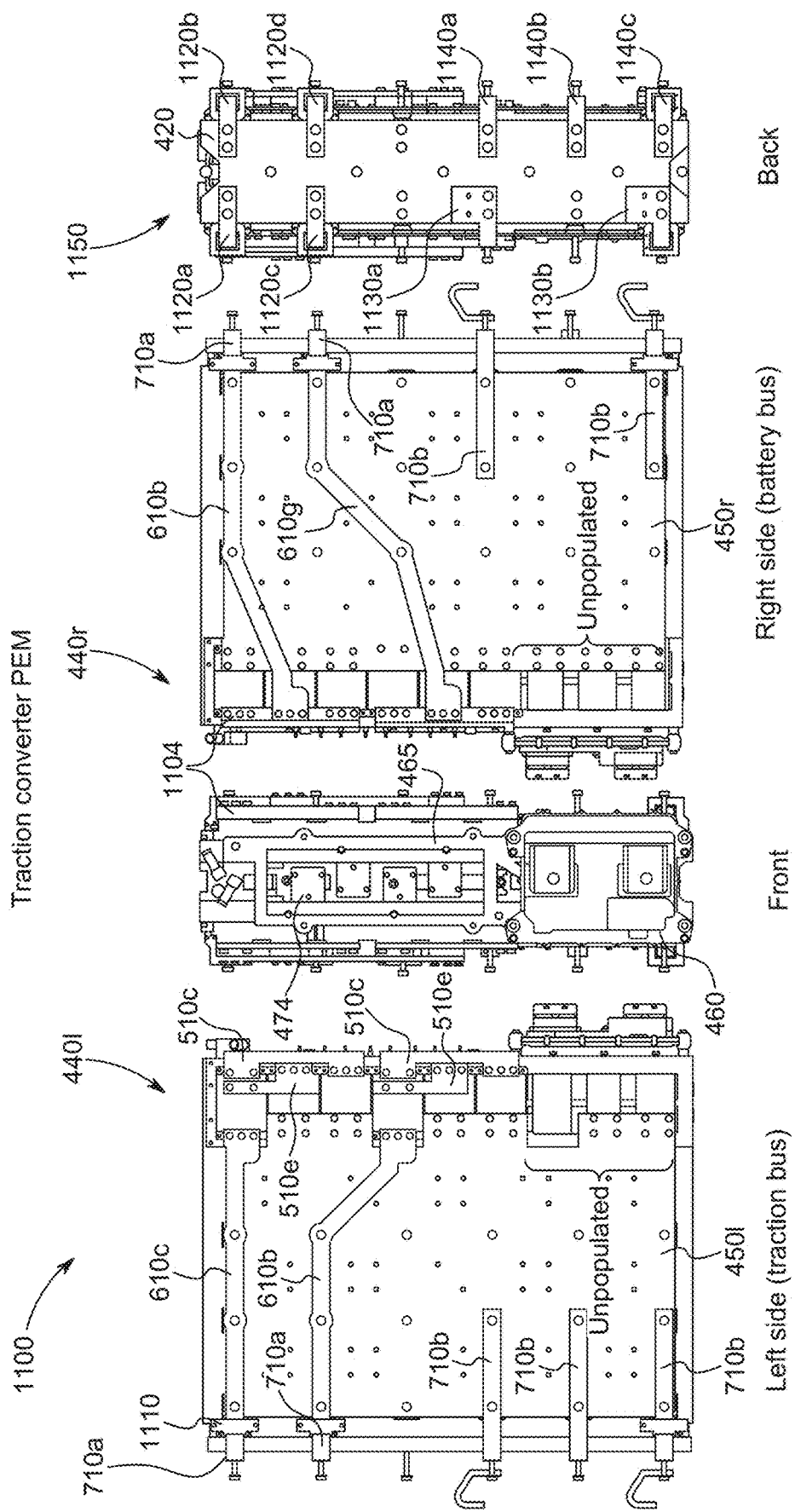
FIGS. 11A, 11B, 11C and 11D are left side, front, right side and rear views, respectively, of the exemplary DC converter circuit illustrated in FIG. 10 as physically realized by an exemplary power electronics module constructed in accordance with the present general inventive concept.

FIG. 10 is an electrical schematic diagram of an exemplary DC converter circuit 1000 that may be implemented by embodiments of the present invention. In the illustrated example, converter circuit 1000 may produce bipolar DC voltage having positive and negative voltages referenced to a common voltage for a DC traction bus from unipolar DC voltage having a positive voltage referenced to a negative voltage from a DC battery bus. To that end, DC converter circuit 1000 may include an input circuit stage 1010 that inverts the battery voltage to a time-varying voltage, a magnetic circuit stage 1020 that may scale the time-varying voltage up and an output circuit stage 1030 that may convert the upscaled time-varying voltage to a bipolar DC voltage that may be used, for example, for traction motors 16 of work machine 10. DC converter circuit 1000 may include one or more current transformers, representatively illustrated at current transformer 1012, and one or more voltage transformers, representatively illustrated at voltage transformer 1014, by which current and voltage, respectively, may be measured for control and timing.

FIGS. 11A-D, taken together, is an illustration of the exemplary DC converter circuit 1000 illustrated in FIG. 10 as physically realized by an exemplary DC converter PEM 1100 constructed in accordance with the present general inventive concept. As described with reference to FIG. 4, DC converter PEM 1100 may comprise a front mounting plate 465 on which an ECM 460 is mechanically attached, and a rear mounting plate 420 defining a port connection plane 1150. Additionally, DC converter PEM 1100 may include left and right semiconductor switch arrays 410l and 410r that are both proximal to front mounting plate 465 and both of which, in this example configuration, are not populated to the full height of DC converter PEM 1100. Left and right semiconductor switch arrays 4101 and 410r may be mechanically and electrically connected to respective left and right circuit boards 4501 and 450r, which may also be electrically connected to respective capacitor arrays (e.g., left and right capacitor arrays 4301 and 430r hidden by respective left and right circuit boards 4501 and 450r as depicted in FIG. 4). Additionally, left semiconductor switch array 4101 may include semiconductor switch packages 445 of mixed polarity while right semiconductor switch array 410r may include semiconductor switch packages 445 of uniform polarity. Current transformer 1012 and voltage transformer 1014 in DC converter circuit 1000 may be realized through individual discrete components, such as current transformer 1110 and voltage transformer 474.

Edge bus connectors 510 illustrated in FIG. 11A that have like reference numerals as FIG. 5 selected from exemplary set 500 thereof may interconnect corresponding semiconductor switches in left semiconductor switch array 4101 to define a power conversion circuit, which in this case is DC converter 1100. As illustrated in FIG. 11D, various PEM ports may be disposed on rear mounting plate 420 to include a battery port comprising a positive terminal 1130b and a negative terminal 1130a, a traction port comprising a positive terminal 1140c, a common terminal 1140b and a negative terminal 1140a, a low voltage (LV) side magnetic circuit port comprising an LV side start terminal 1120a and an LV side finish terminal 1120c, and a medium voltage (MV) side magnetic circuit port comprising an MV side start terminal 1120b and an MV side finish terminal 1120d. Transverse bus conductors 610, as illustrated in FIG. 11C with like reference numerals as FIG. 6, selected from exemplary set 600 thereof may be disposed over left and right circuit boards 4501 and 450 to transfer relevant PEM ports from locations relatively closer to front mounting plate 465, referred to herein as "interior circuit terminals," to port connection plane 1150 on rear mounting plate 420. Various port bus conductors selected from the set 700 thereof may be employed to form the port terminals described above disposed on rear mounting plate 420. In certain embodiments, electrical connections in semiconductor switch arrays 4101 and 410r can be realized on different planes, such as by use of conductive riser blocks representatively illustrated at riser block 1104 (FIGS. 11B and 11C).

Figure 12:
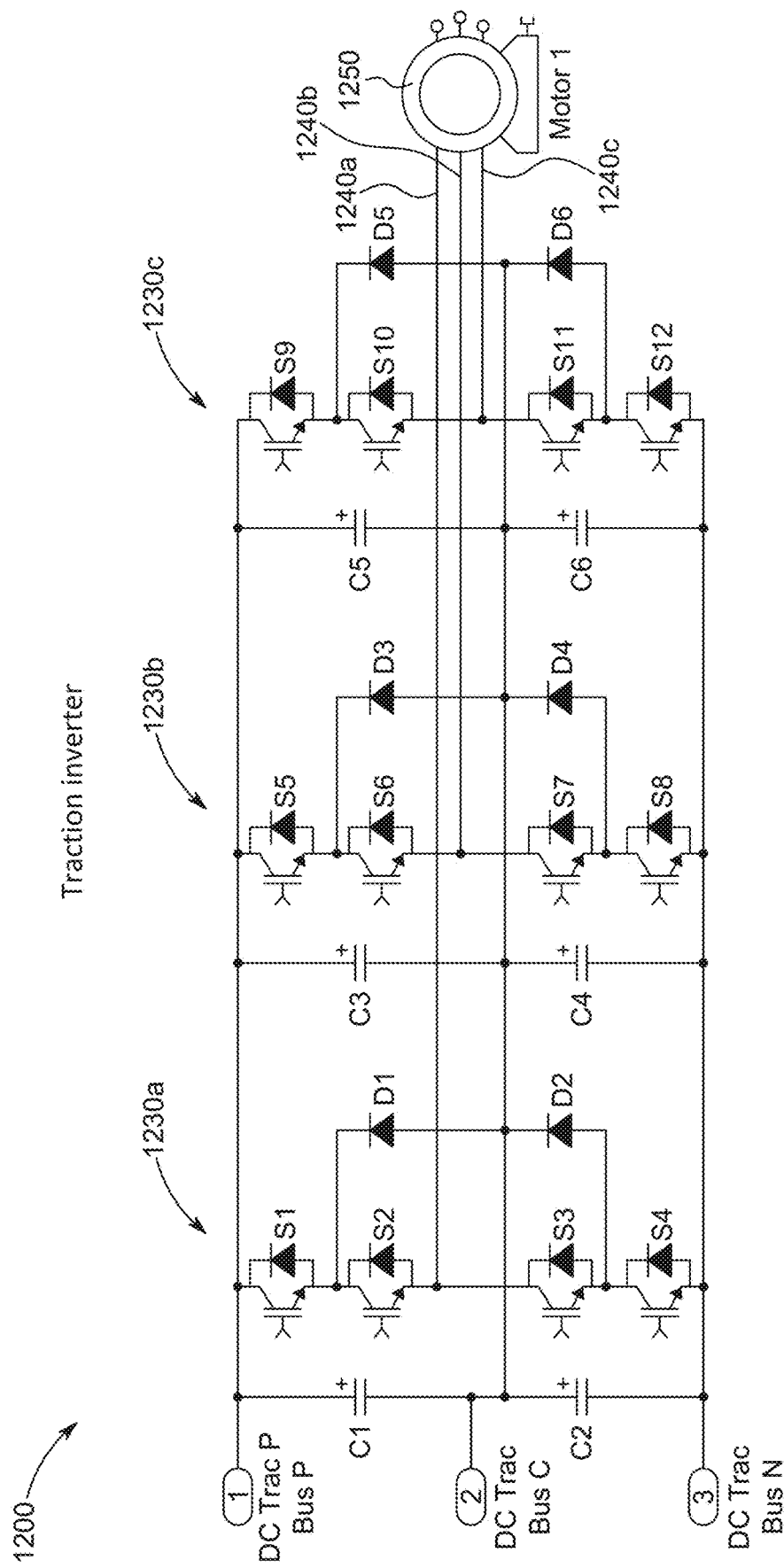
FIG. 12 is an electrical schematic diagram of an exemplary inverter circuit that may be implemented by embodiments of the present invention.
Figure 13:
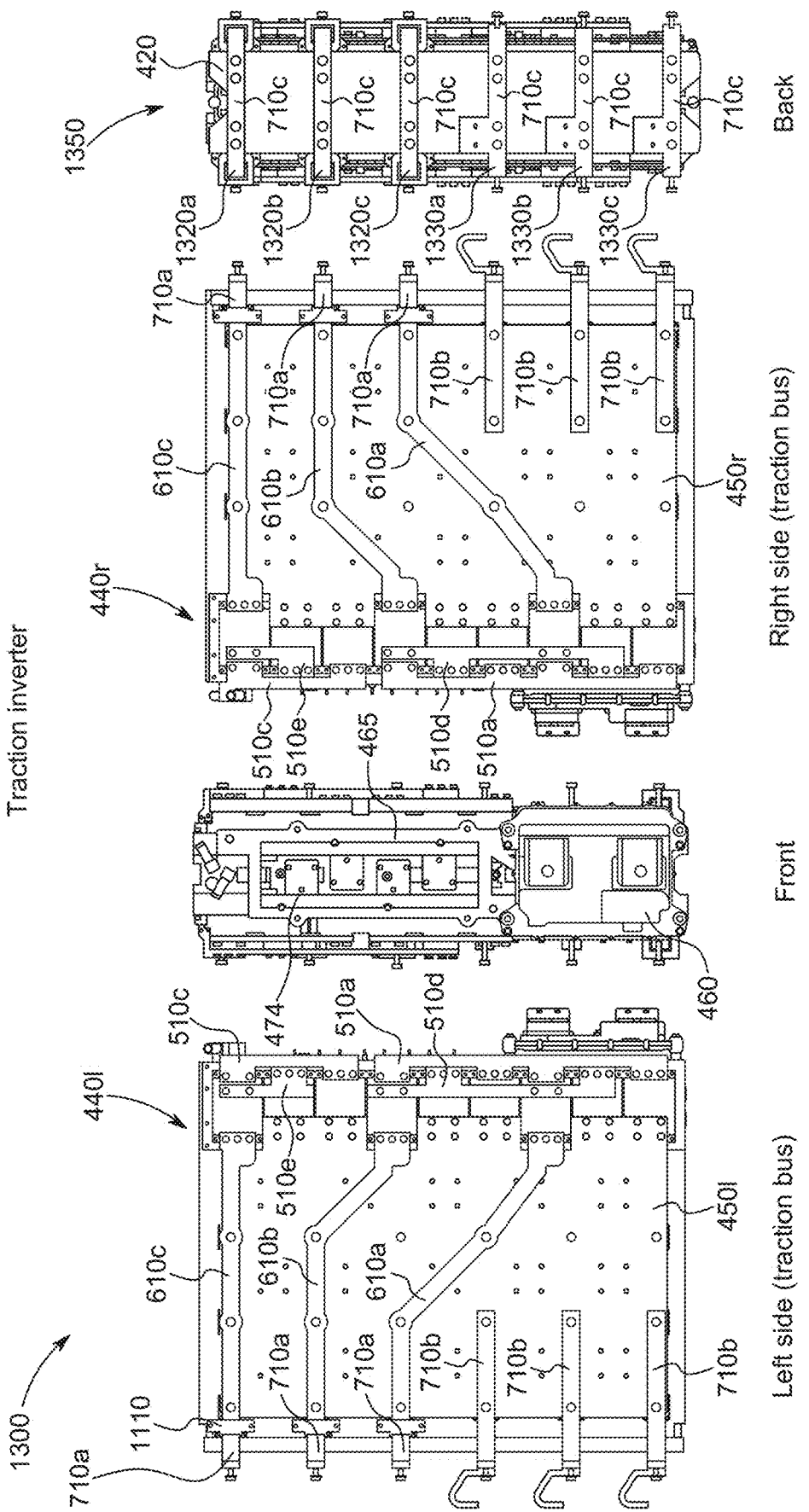
FIGS. 13A, 13B, 13C and 13D are left side, front, right side, and rear views, respectively, of the exemplary inverter circuit illustrated in FIG. 12 as physically realized by an exemplary power electronics module constructed in accordance with the present general inventive concept.

FIG. 12 is an electrical schematic diagram of an exemplary inverter circuit 1200 that may be implemented by embodiments of the present invention. Inverter circuit 1200 may comprise three (3) NPC inverter stages 1230a-1230c that by prudent application of timing signals produce three (3) AC phases on conductors 1240a-1240c, respectively, from the bipolar DC traction bus voltage produced by DC converter PEM 1200 for operating a traction motor 1250.

FIGS. 13A-D, taken together, is an illustration of the exemplary inverter circuit 1200 illustrated in FIG. 12 as physically realized by an exemplary traction inverter PEM 1300 constructed in accordance with the present general inventive concept. Skilled artisans will appreciate and understand the functionality of various structural and electrical features of traction inverter PEM 1300 from descriptions of like structural and electrical features already described with reference to FIGS. 11A-D and such descriptions will not be repeated here. Certain exemplary features not previously explained may include physical circuit implementations that are symmetric about center plate 415, including identical left and right semiconductor switch arrays 4101 and 410r, identical circuit boards 4501 and 450r, identical edge bus conductors 510 selected from set 500 thereof and identical transverse bus conductors 610 selected from set 600 thereof, etc. The identical inverter circuits on each side of the center plate 415 may include motor ports comprising a motor phase A terminal 1320a, a motor phase B terminal 1320b, a motor phase C terminal 1320c, a DC traction bus negative terminal 1330a, a DC traction bus common terminal 1330b and a DC traction bus positive terminal 1330c. Additionally, the identical inverter circuits on each side of the center plate may be electrically connected in parallel at port connection plane 1350 by prudent selection of one or more port bus connectors 710.

Figure 14:
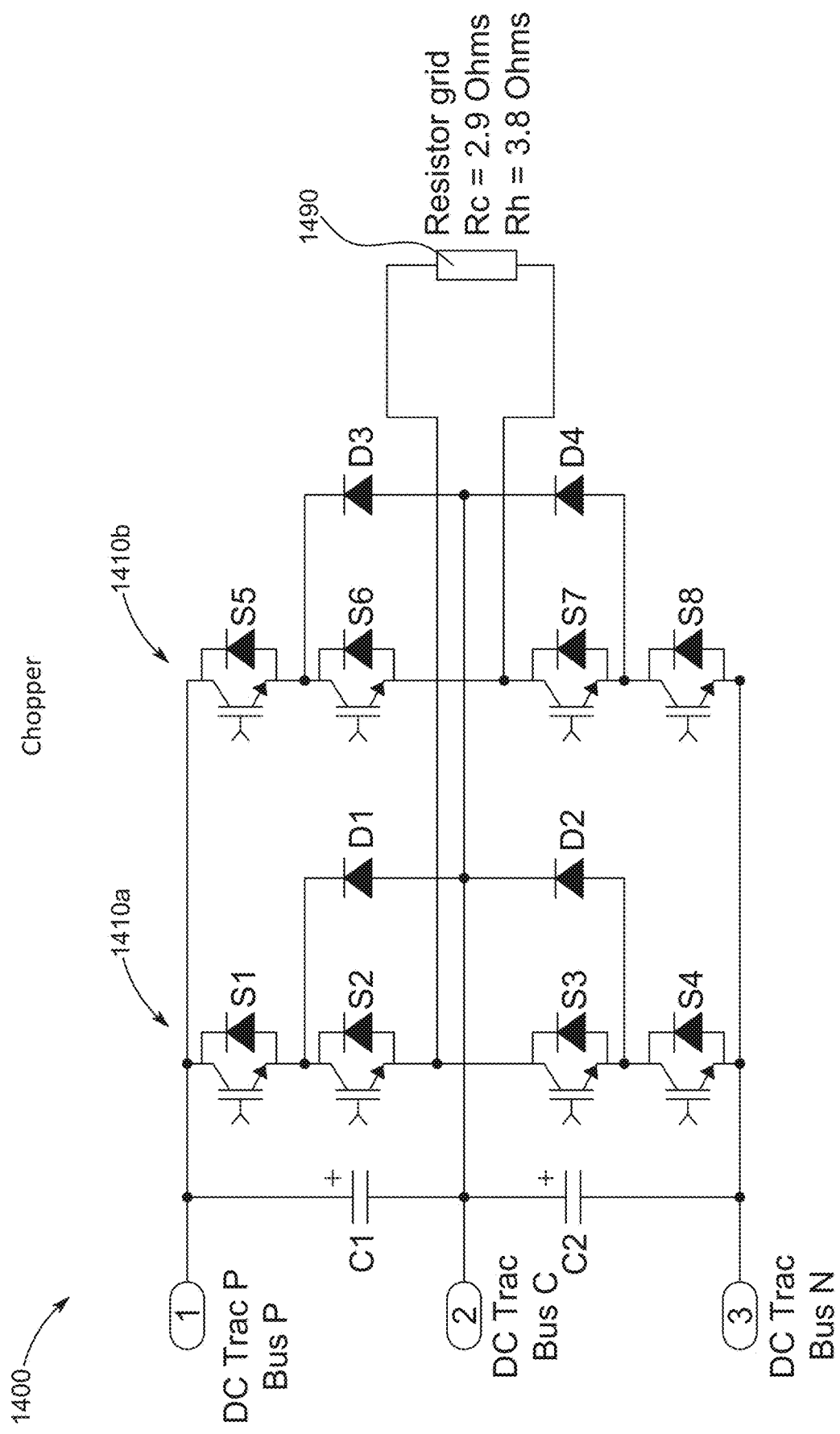
FIG. 14 is an electrical schematic diagram of an exemplary chopper circuit that may be implemented by embodiments of the present invention.
Figure 15:
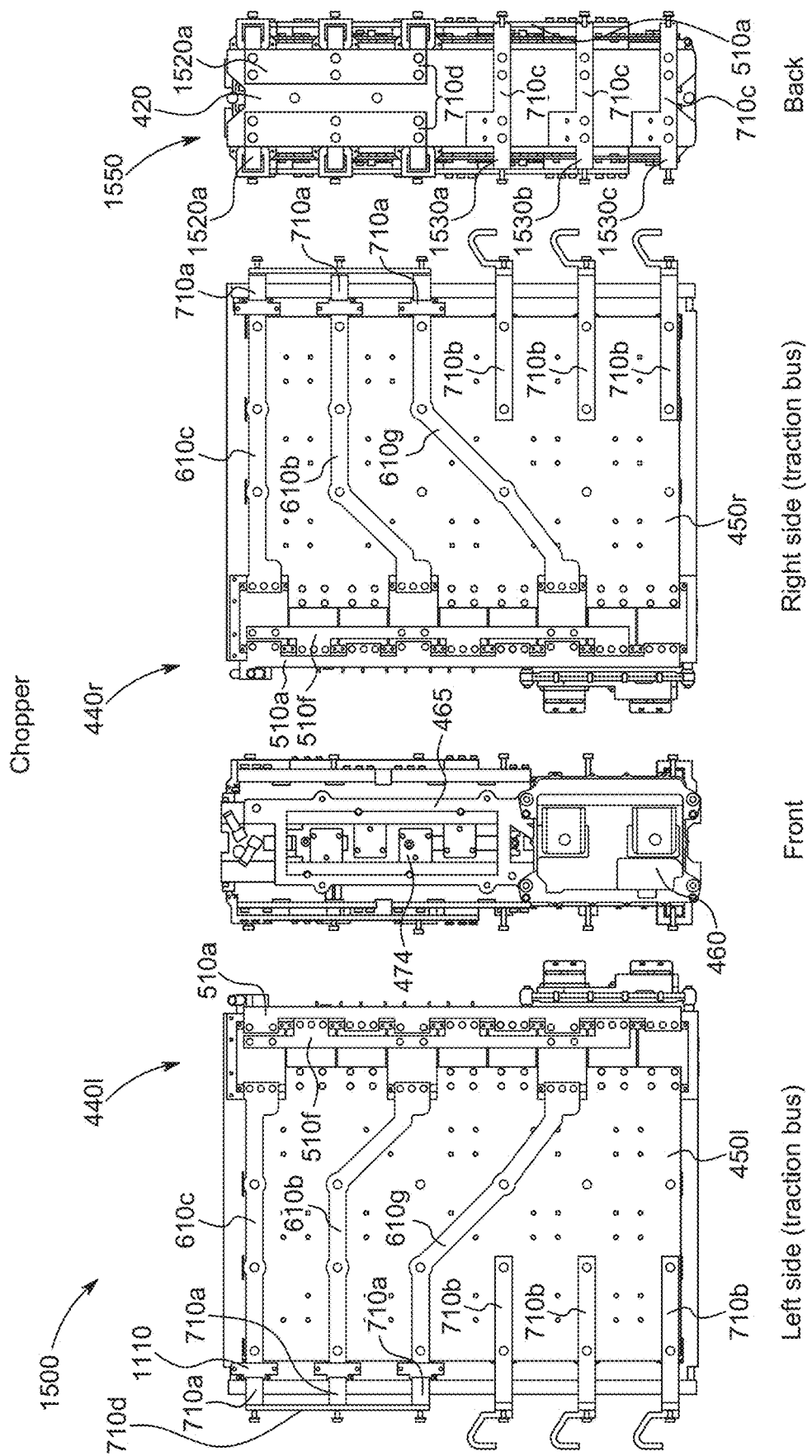
FIGS. 15A, 15B, 15C and 15D are left side, front, right side, and rear views, respectively, of the exemplary chopper circuit illustrated in FIG. 14 as physically realized by an exemplary power electronics module constructed in accordance with the present general inventive concept.

FIG. 14 is an electrical schematic diagram of an exemplary chopper circuit 1400 that may be implemented by embodiments of the present invention. Chopper circuit 1400 may comprise a pair of NPC inverter stages 1410a and 1410b that operate to divert current generated in traction motors, such as when traveling downhill, to a resistor grid 1490 where the generated current is dissipated as heat.

FIGS. 15A-D, taken together, is an illustration of the exemplary chopper circuit 1400 illustrated in FIG. 14 as physically realized by an exemplary chopper PEM 1500 constructed in accordance with the present general inventive concept. Skilled artisans will appreciate and understand the functionality of various structural and electrical features of chopper PEM 1500 from descriptions of like structural and electrical features already described with reference to FIGS. 11A-D and 13A-D, and such descriptions will not be repeated here. Exemplary chopper PEM 1500 may also be symmetrical about center plate 415 with outputs of inverter stages 1410a and 1410b being connected to opposing sides of resistor grid 1490. Various PEM ports may be disposed on rear mounting plate 420 to include a chopper port comprising chopper start terminal 1520a and a chopper finish terminal 1520b. A traction port may also be disposed on rear mounting plate comprising a positive terminal 1530c, a common terminal 1520b and a negative terminal 1530a.

Figure 16:
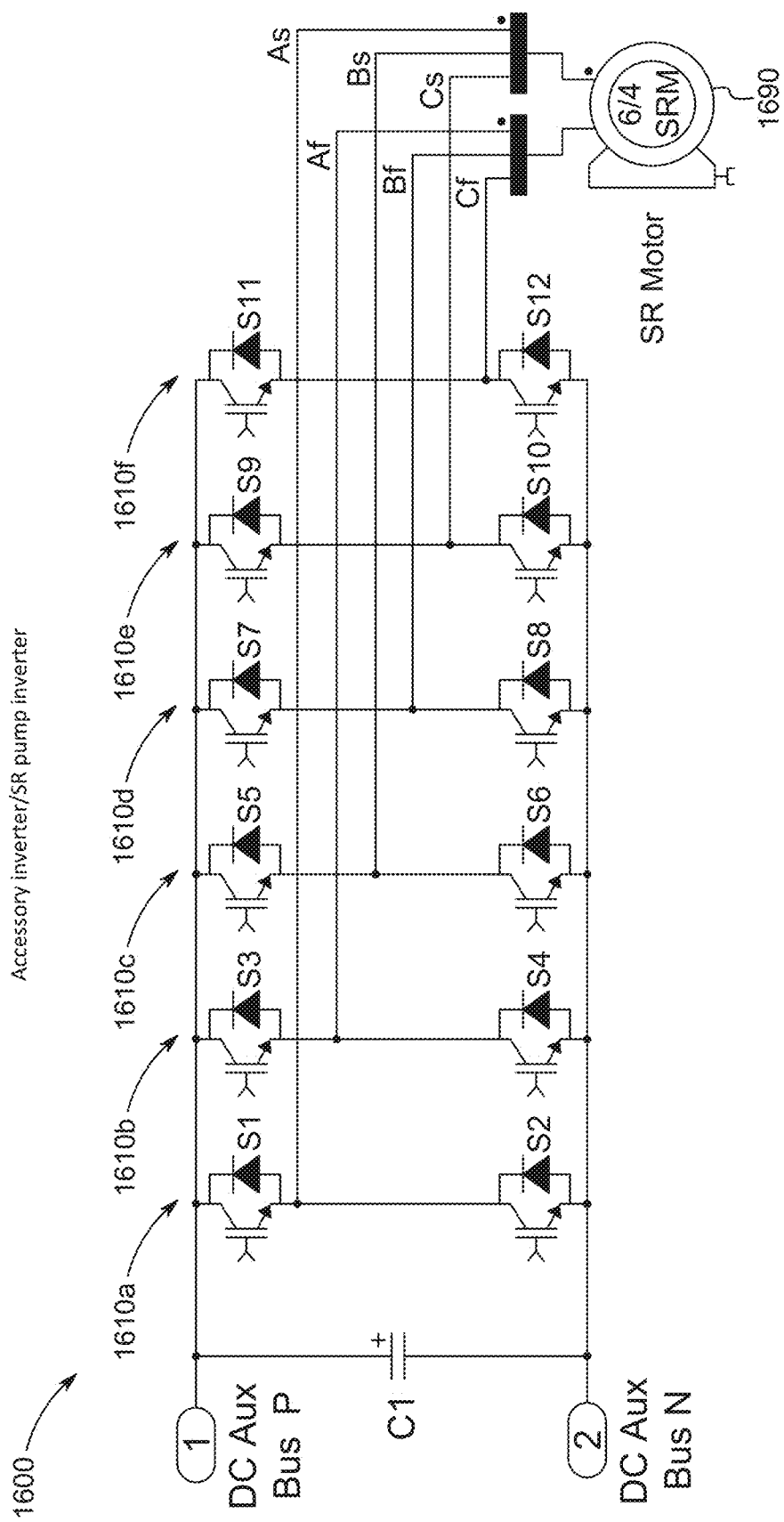
FIG. 16 is an electrical schematic diagram of an exemplary accessory AC/switched reluctance (SR) inverter circuit that may be implemented by embodiments of the present invention.
Figure 17:
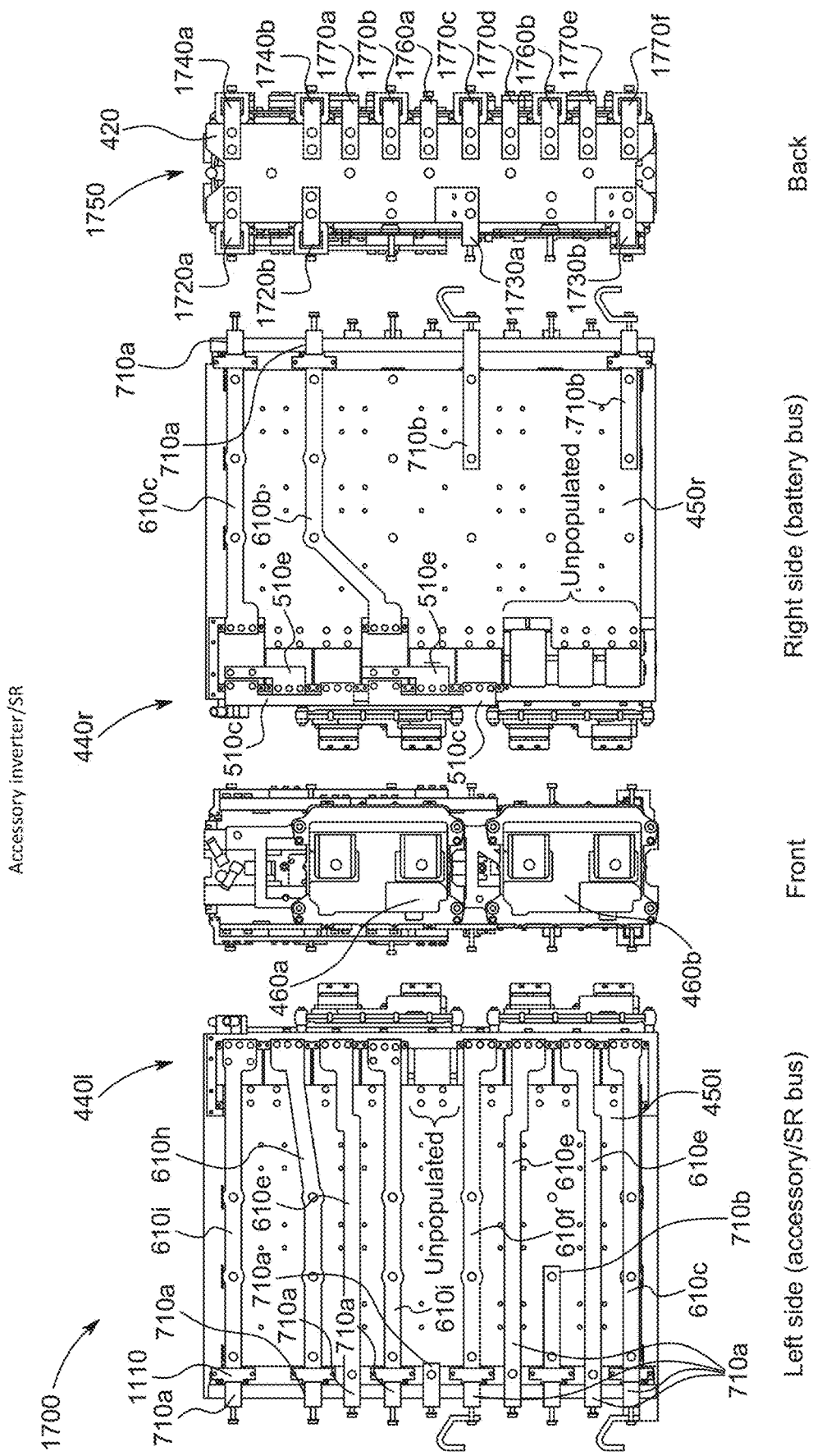
FIGS. 17A, 17B, 17C, and 17D are left side, front, right side, and rear views, respectively, of the exemplary accessory AC/switched reluctance (SR) inverter circuit illustrated in FIG. 16 as physically realized by an exemplary power electronics module constructed in accordance with the present general inventive concept.

FIG. 16 is an electrical schematic diagram of an exemplary accessory AC/switched reluctance (SR) driver circuit 1600 that may be implemented by embodiments of the present invention. Accessory AC/switched reluctance (SR) inverter circuit 1600 may comprise a set of half-bridge stages 1610a-1610f electrically connected between positive and negative voltages provided by a DC auxiliary bus. Outputs of half-bridge stages 1610a-1610f may be provided to a SR motor 1690, which may drive a hydraulic pump motor of work machine 10. It is to be understood that motors other than switched reluctance motors can be used to embody the present inventive concept. Indeed, accommodating different motor types by selection from the set 500 of edge bus conductors is considered a beneficial feature of the present inventive concept.

FIGS. 17A-D, taken together, is an illustration of the exemplary accessory AC/switched reluctance (SR) driver circuit 1600 illustrated in FIG. 16 as physically realized by an exemplary accessory AC/switched reluctance (SR) inverter PEM 1700 constructed in accordance with the present general inventive concept. In certain embodiments, a PEM constructed in accordance with the present inventive concept may implement separate and distinct circuits that require individual timing and control. Accordingly, PEM 1700 may include ECMs 460a and 460b to provide timing and control signals to the separate circuits. Various PEM ports may be disposed over port connection plane 1750 to include an MV side magnetic circuit port comprising an MV side start terminal 1720a and an MV side finish terminal 1720b, and an LV side magnetic circuit port comprising an LV side start terminal 1740a and an LV side finish terminal 1730b. PEM ports of PEM 1700 may include a battery port comprising a positive terminal 1730*b* and a negative terminal 1730*a*, an auxiliary port comprising a positive terminal 1730*b* and a negative terminal 1730*a*, and an SR motor port comprising phase terminals 1770*a*-1770*f*.

Figure 18:
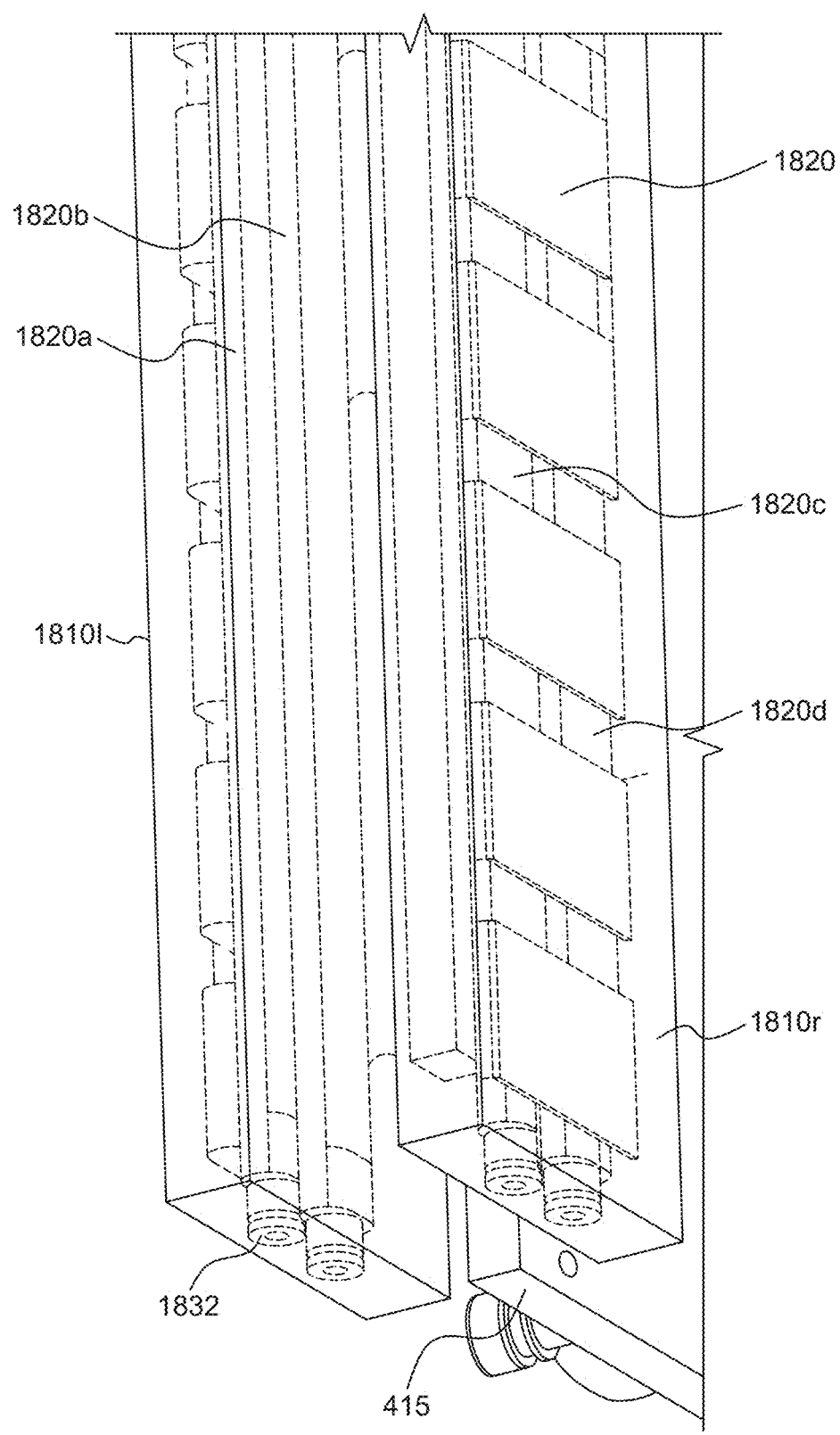
FIG. 18 is an illustration of a pair of heatsinks that can be used in embodiments of the present inventive concept.

FIG. 18 is an illustration of a pair of heatsinks 18101 and 1810*r* that can be used in embodiments of the present inventive concept. Left and right heatsinks 18101 and 1810*r* may be symmetrically arranged about center plate 415 and may comprise an array of component pads, representatively illustrated at component pad 1820, that may be in thermal communication with coolant circulation channels 1820*a*-1820*d*. Coolant sufficient to convey heat away from the heat-generating semiconductor switches, such as a 50/50 water ethylene glycol, may be compelled to flow across component pads 1820, such as by a coolant circulation pump, and be subsequently cooled by a thermal management system comprising fans/blowers, heat exchangers, etc., such as thermal management system 14 illustrated in FIG. 1. Hose connections, such as that illustrated at hose connection 1832, are also connected in accordance with parallel or series flow in heatsinks 18101 and 1810*r*. In parallel flow implementations, the semiconductor switches on both sides of the PEM are cooled within a more consistent temperature range, but at the cost of requiring more flow from the coolant circulation pump. Series flow implementations increase flow across individual semiconductor switches as compared to parallel coolant flow. System level trade-offs may be evaluated to determine whether each PEM implementation should be connected for series or parallel coolant flow.

Figure 19A:
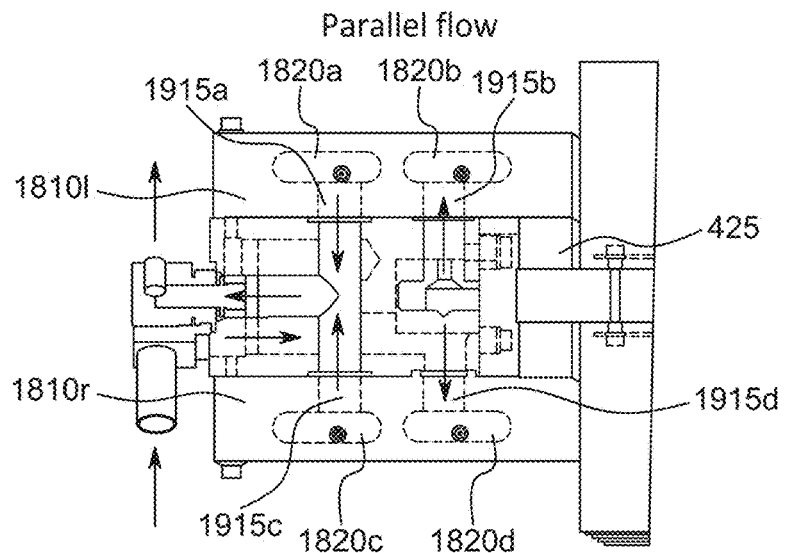
FIGS. 19A, 19B, and 19C are top, perspective, and bottom views, respectively, of a manifold and its connections to heatsinks for series or parallel cooling in accordance with the present inventive concept.
Figure 19B:
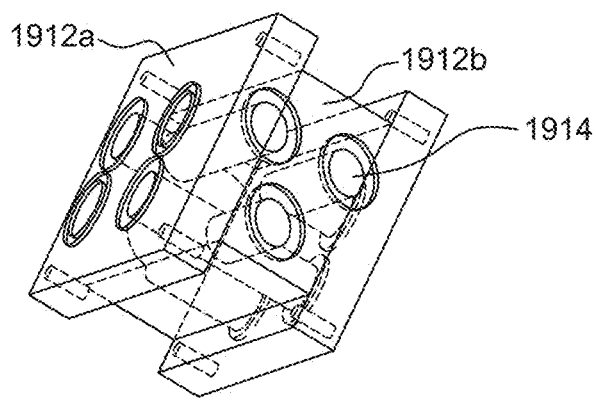
Figure 19C:
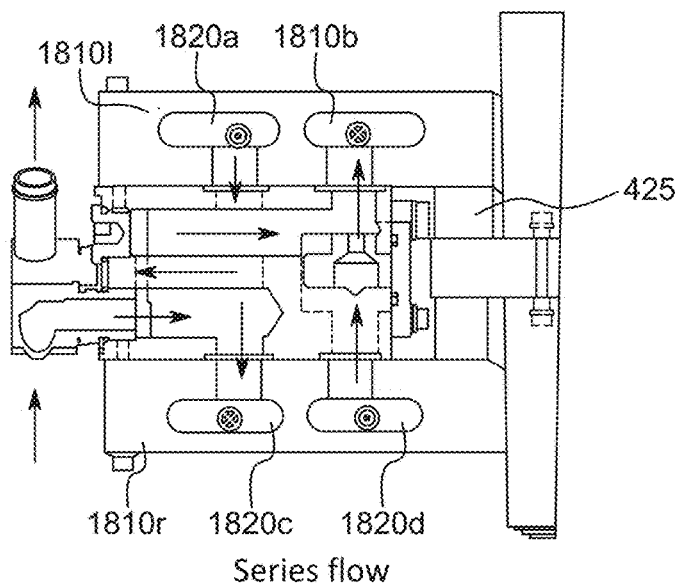

FIGS. 19A-C, taken together, is an illustration of a coolant manifold 1910 connecting heatsinks 18101 and 1810*r* for series or parallel cooling in accordance with the present inventive concept. Coolant manifold 1910 may be constructed or otherwise configured to support both parallel and series coolant flow depending on what coolant manifold surface 1912*a* or 1912*b* faces heatsinks 18101 and 1810*r*. That is, aligning coolant manifold ports, representatively illustrated at coolant manifold port 1914, on different surfaces 1912*a* and 1912*b* with corresponding heatsink coolant ports 1915*a*-1915*d* on heatsinks 18101 and 1810*r* may determine whether coolant flow therethrough proceeds through coolant circulation channels 1820*a*-1820*d* in parallel or series. For example, when coolant manifold ports 1914 on face 1912*b* of coolant manifold 1910 are aligned with heatsink coolant ports 1915*a*-1915*d* on respective heatsinks 18101 and 1810*r*, parallel coolant flow may occur through coolant circulation channels 1820*a*-1820*d*. On the other hand, when coolant ports 1914 on face 1912*a* of coolant manifold 1910 are aligned with heatsink coolant ports 1915*a*-1915*d* on respective heatsinks 18101 and 1810*r*, series coolant flow may occur through coolant circulation channels 1820*a*-1820*d*.

The descriptions above are intended to illustrate possible implementations of the present inventive concept and are not restrictive. Many variations, modifications and alternatives will become apparent to the skilled artisan upon review of this disclosure. For example, components equivalent to those shown and described may be substituted therefore, elements and methods individually described may be combined, and elements described as discrete may be distributed across many components. The scope of the invention should therefore be determined not with reference to the description above, but with reference to the appended claims, along with their full range of equivalents.

INDUSTRIAL APPLICABILITY

As electrification, the replacement of greenhouse gas emitting power technologies with electrical, greenhouse gas mitigating technologies, becomes prevalent in a greater number of industries, there is a greater desire for adaptable components that can be configured for powering different functions within the same apparatus or system. That is, a core assembly may be constructed that, by introduction of adapting components, can be configured to supply different power levels (voltage and current) for the apparatus. Moreover, it may be desirable to provide the different power levels from a central distribution point, such as a power cabinet. The present general inventive concept achieves these advantages through a flexible power electronics module that can be configured for different power inputs and outputs while conforming to a form factor defined by the construction of the power cabinet.

What is claimed is:

1. A power electronics module (PEM) constructed to convert electricity from an input form provided at a PEM input port thereof to an output form provided at a PEM output port thereof, the power electronics module comprising:
   a front mounting plate and a rear mounting plate on which the PEM input port and the PEM output port are disposed;
   electrical power conversion subcircuits having input and output ports proximal to the front mounting plate;
   rigid conductor elements having respective preformed shapes constructed to electrically interconnect the subcircuits at the input and the output ports thereof to form a power conversion circuit selected from among multiple power conversion circuits configurable solely by selection of the conductor elements, the selected power conversion circuit having input and output ports proximal to the front mounting plate;
   other rigid conductor elements having respective preformed shapes constructed to electrically interconnect the input port of the selected power conversion circuit to the PEM input port disposed on the rear mounting plate and to interconnect the output port of the selected power conversion circuit to the PEM output port disposed on the rear mounting plate; and
   a controller mechanically coupled to the front mounting plate and constructed to operate semiconductor switches in a prescribed timing that converts the electricity of the input form to the electricity of the output form by the selected power conversion circuit.

2. The PEM of claim 1, further comprising:
   an array of semiconductor switch packages all having a common semiconductor switch package form factor and internal architecture of respective semiconductor switches contained therein;
   an array of capacitor packages physically separated from the array of semiconductor switch packages and all having a common capacitor form factor; and
   a circuit board mechanically coupling the array of semiconductor switch packages and the array of capacitor packages in coplanar adjacency while electrically interconnecting the capacitors in the respective capacitor packages and the semiconductor switches in the respective semiconductor switch packages into the power conversion subcircuits.

3. The PEM of claim 1, further comprising a rigid mounting plate having one side on which the power conversion subcircuits are disposed and another side on which other power conversion subcircuits are disposed.

4. The PEM of claim 3, wherein the other power conversion subcircuits on the other side of the rigid mounting plate are interconnected by the rigid conductor elements to form another power conversion circuit selected from the multiple power conversion circuits by which the electricity of the output form is generated that is other than the output form generated by the power conversion circuit on the side of the rigid mounting plate.

5. The PEM of claim 4, wherein the other power conversion subcircuits comprise:
   another array of the semiconductor switch packages;
   another array of the capacitor packages; and
   another circuit board mechanically coupling the other array of semiconductor switch packages and the other array of capacitor packages in coplanar adjacency while electrically interconnecting the capacitors in the respective capacitor packages and the semiconductor switches in the respective semiconductor switch packages into the other power conversion subcircuits.

6. The PEM of claim 5, wherein the other circuit board differs in construction from the circuit board in accordance with a difference between the other power conversion circuit and the power conversion circuit.

7. The PEM of claim 5, further comprising:
   an intermediate circuit input port and an intermediate circuit output port disposed on the rear mounting plate; and
   intermediate conductor elements within the other rigid conductor elements that electrically couple the output port of the power conversion circuit to the intermediate circuit input port and from the intermediate circuit output port to the input port of the other power conversion circuit.

8. The PEM of claim 7, wherein the power conversion circuit is configured by selection of the rigid conductor elements as a DC to AC inverter and the other power conversion circuit is configured by selection of the rigid conductor elements as an AC to DC converter.

9. The PEM of claim 3, wherein the power conversion subcircuits on the other side of the rigid mounting plate are interconnected by the rigid conductor elements to form another power conversion circuit selected from the multiple power conversion circuits that generates the electricity of the output form that is alike the output form generated by the power conversion circuit on the side of the rigid mounting plate.

10. The PEM of claim 9, further comprising a wrapping conductor element within the other rigid conductor elements constructed to traverse the rear mounting plate and electrically couple the output port of the power conversion circuit to the output port of the other power conversion circuit.

11. The PEM of claim 3, further comprising another controller mechanically coupled to the front mounting plate and constructed to operate the other semiconductor switches in another prescribed timing that is independent of the prescribed timing of the semiconductor switches.

12. A power cabinet constructed to provide electricity of multiple forms for operation of different systems of a work machine from electricity of a single form, the power cabinet comprising:
   module bays constructed to receive respective power electronics modules (PEMs) in alignment with respective electrical busses disposed at the rear of the power cabinet, each of the PEMs being constructed to provide a corresponding one of the multiple forms of electricity and comprising:
      a rigid mounting assembly including a front mounting plate and a rear mounting plate on which a PEM input port and a PEM output port;
      electrical power conversion subcircuits having input and output ports proximal to the front mounting plate;
      rigid conductor elements having respective preformed shapes constructed to electrically interconnect the power conversion subcircuits at the input and output ports thereof to form a power conversion circuit selected from among multiple power conversion circuits configurable solely by selection of the conductor elements, the selected power conversion circuit having input and output ports proximal to the front mounting plate;
      other rigid conductor elements having respective preformed shapes constructed to electrically interconnect the input port of the selected power conversion circuit to the PEM input port disposed on the rear mounting plate and to interconnect the output port of the selected power conversion circuit to the PEM output port disposed on the rear mounting plate; and
      a controller mechanically coupled to the front mounting plate and constructed to operate the semiconductor switches in a prescribed timing for the selected power conversion circuit by which the electricity of the input form is converted to a corresponding one of the multiple forms of electricity.

13. The power cabinet of claim 12, wherein the rigid mounting plate of the PEMs has one side on which the power conversion subcircuits are disposed and another side on which other power conversion subcircuits are disposed, wherein the other power conversion subcircuits are interconnected by the rigid conductor elements to form another power conversion circuit selected from the multiple power conversion circuits that produces one of the multiple forms of electricity that is other than that produced by the power conversion circuit.

14. The power cabinet of claim 13, wherein at least one of the PEMs further comprises:
   an intermediate circuit input port and an intermediate circuit output port disposed on the rear mounting plate; and
   intermediate conductor elements within the other rigid conductor elements that electrically couple the input port of the power conversion circuit to the intermediate circuit input port and from the intermediate circuit output port to the output port of the other power conversion circuit.

15. The power cabinet of claim 14, further comprising:
   a magnetic circuit module received in one of the module bays and comprising an input port and an output port; and
   one of the busses constructed to electrically interconnect the intermediate output port to the input port of the magnetic circuit and the intermediate circuit output port to the input port of the magnetic circuit.

16. The power cabinet of claim 15, wherein the magnetic circuit module is electrically interposed between the power conversion circuit and the other power conversion circuit of a single PEM that converts unipolar DC power as the electricity of the first form provided to the input port of the power conversion circuit to bipolar DC power provided as one of the multiple forms provided at the output port of the other power conversion circuit.

17. The power cabinet of claim 16, wherein the electrical busses include a bipolar DC bus that align with the output port of the single PEM and constructed to come into electrical contact therewith when the single PEM is fully received in a corresponding one of the module bays, the bipolar DC bus spanning across the power cabinet to come into the electrical contact with the output ports of a set of the PEMs received in respective module bays that are configured identically as the single PEM, the set of PEMs operating electrically in parallel each with the others.

18. The power cabinet of claim 16, wherein the electrical busses include a multiphase AC bus that aligns with the output port of another single PEM that produces multiphase AC power from the bipolar DC provided at the bipolar DC bus and constructed to come into electrical contact therewith when the other single PEM is fully received in a corresponding one of the module bays, the multiphase AC bus spanning across the power cabinet to come into the electrical contact with the output ports of a set of the PEMs received in respective module bays that are configured identically as the other single PEM, the set of other single PEMs operating electrically in parallel each with the others.

19. A work machine comprising an onboard DC power source and components requiring multiple forms of electricity that interoperate to perform work by the work machine, the work machine comprising:
   a set of power electronics modules (PEMs) collectively producing the multiple forms of electricity from the onboard DC power source, each of the PEMs comprising:
      a rigid mounting including a front mounting plate and a rear mounting plate on which a PEM input port and a PEM output port are disposed;
      electrical power conversion subcircuits having input and output ports proximal to the front mounting plate;
      rigid conductor elements having respective preformed shapes constructed to electrically interconnect the power conversion subcircuits at the input and output ports thereof to form a power conversion circuit selected from among multiple power conversion circuits configurable solely by selection of the conductor elements, the selected power conversion circuit having input and output ports proximal to the front mounting plate;
      other rigid conductor elements having respective preformed shapes constructed to electrically interconnect the input port of the selected power conversion circuit to the PEM input port disposed on the rear mounting plate and to interconnect the output port of the selected power conversion circuit to the PEM output port disposed on the rear mounting plate; and
      a controller mechanically coupled to the front mounting plate and constructed to operate the semiconductor switches in a prescribed timing for the selected power conversion circuit by which the electricity of the input form is converted to a corresponding one of the multiple forms of electricity.

20. The work machine of claim 19, wherein the power conversion subcircuits of each of the PEMs includes:
   an array of semiconductor switch packages all having a common semiconductor switch package form factor and internal architecture of respective semiconductor switches contained therein;
   an array of capacitor packages physically separated from the array of semiconductor switch packages and all having a common capacitor package form factor; and
   a circuit board mechanically coupling the array of semiconductor switch packages and the array of capacitor packages in coplanar adjacency while electrically interconnecting the capacitors in the respective capacitor packages and the semiconductor switches in the respective semiconductor switch packages into the power conversion subcircuits.

* * * * *